(12) United States Patent
Jung et al.

(10) Patent No.: US 12,022,658 B2
(45) Date of Patent: Jun. 25, 2024

(54) THREE-DIMENSIONAL (3D) SEMICONDUCTOR MEMORY DEVICE

(71) Applicant: SAMSUNG ELECTRONICS CO., LTD., Suwon-si (KR)

(72) Inventors: Kwangyoung Jung, Hwaseong-si (KR); Sangyoun Jo, Suwon-si (KR); Kohji Kanamori, Seongnam-si (KR); Jeehoon Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/356,064

(22) Filed: Jul. 20, 2023

(65) Prior Publication Data

US 2023/0371260 A1    Nov. 16, 2023

Related U.S. Application Data

(63) Continuation of application No. 17/983,024, filed on Nov. 8, 2022, now Pat. No. 11,778,834, which is a
(Continued)

(30) Foreign Application Priority Data

May 18, 2020    (KR) ........................ 10-2020-0059307

(51) Int. Cl.
*H10B 43/40*    (2023.01)
*G11C 7/18*    (2006.01)
(Continued)

(52) U.S. Cl.
CPC .............. *H10B 43/40* (2023.02); *G11C 7/18* (2013.01); *G11C 16/08* (2013.01); *H10B 41/10* (2023.02);
(Continued)

(58) Field of Classification Search
CPC ......... H01L 27/11565; H01L 27/11568; H01L 27/1157; H01L 27/11519; H01L 27/11521;
(Continued)

(56) References Cited

U.S. PATENT DOCUMENTS 9,019,739 B2    4/2015    Park et al.
9,377,955 B2    6/2016    Lee et al.
(Continued)

FOREIGN PATENT DOCUMENTS

| KR | 10-20160136919 | 11/2016 |
|---|---|---|
| KR | 2017-0083187 | 7/2017 |
| KR | 2020-0022252 | 3/2020 |

*Primary Examiner* — Amar Movva
(74) *Attorney, Agent, or Firm* — Fish & Richardson P.C.

(57) ABSTRACT

A 3D semiconductor memory device includes a peripheral circuit structure including a first row decoder region, a second row decoder region, and a control circuit region between the first and second row decoder regions, a first electrode structure and a second electrode structure on the peripheral circuit structure, spaced apart in a first direction, and each including stacked electrodes, a mold structure on the peripheral circuit structure between the first and second electrode structures and including stacked sacrificial layers, vertical channel structures penetrating the first and second electrode structures, a separation insulating pattern provided between the first electrode structure and the mold structure and penetrating the mold structure, and a separation structure intersecting the first electrode structure in the first direction and extending to the separation insulating pattern, wherein a maximum width of the separation insulating pattern in a second direction is greater than a maximum width of the separation structure in the second direction.

20 Claims, 32 Drawing Sheets

Related U.S. Application Data continuation of application No. 17/095,821, filed on Nov. 12, 2020, now Pat. No. 11,521,981.

(51) Int. Cl.
| | |
|---|---|
| *G11C 16/08* | (2006.01) |
| *H10B 41/10* | (2023.01) |
| *H10B 41/27* | (2023.01) |
| *H10B 41/43* | (2023.01) |
| *H10B 43/10* | (2023.01) |
| *H10B 43/27* | (2023.01) |

(52) U.S. Cl.
CPC ............. *H10B 41/27* (2023.02); *H10B 41/43* (2023.02); *H10B 43/10* (2023.02); *H10B 43/27* (2023.02)

(58) Field of Classification Search
CPC ..... H01L 27/11524; H01L 21/565–566; H10B 43/10; H10B 43/30; H10B 43/35; H10B 41/10; H10B 41/30; H10B 41/35
See application file for complete search history.

(56) References Cited

U.S. PATENT DOCUMENTS

| | | |
|---|---|---|
| 9,424,928 B2 | 8/2016 | Hwang et al. |
| 10,026,749 B2 | 7/2018 | Park et al. |
| 10,580,463 B2 | 3/2020 | Nishizaki |
| 11,069,698 B2 | 7/2021 | Kim et al. |
| 2016/0343727 A1 | 11/2016 | Kim et al. |
| 2019/0057898 A1 | 2/2019 | Shim et al. |
| 2019/0237477 A1 | 8/2019 | Baek et al. |
| 2019/0295605 A1 | 9/2019 | Nishizaki |

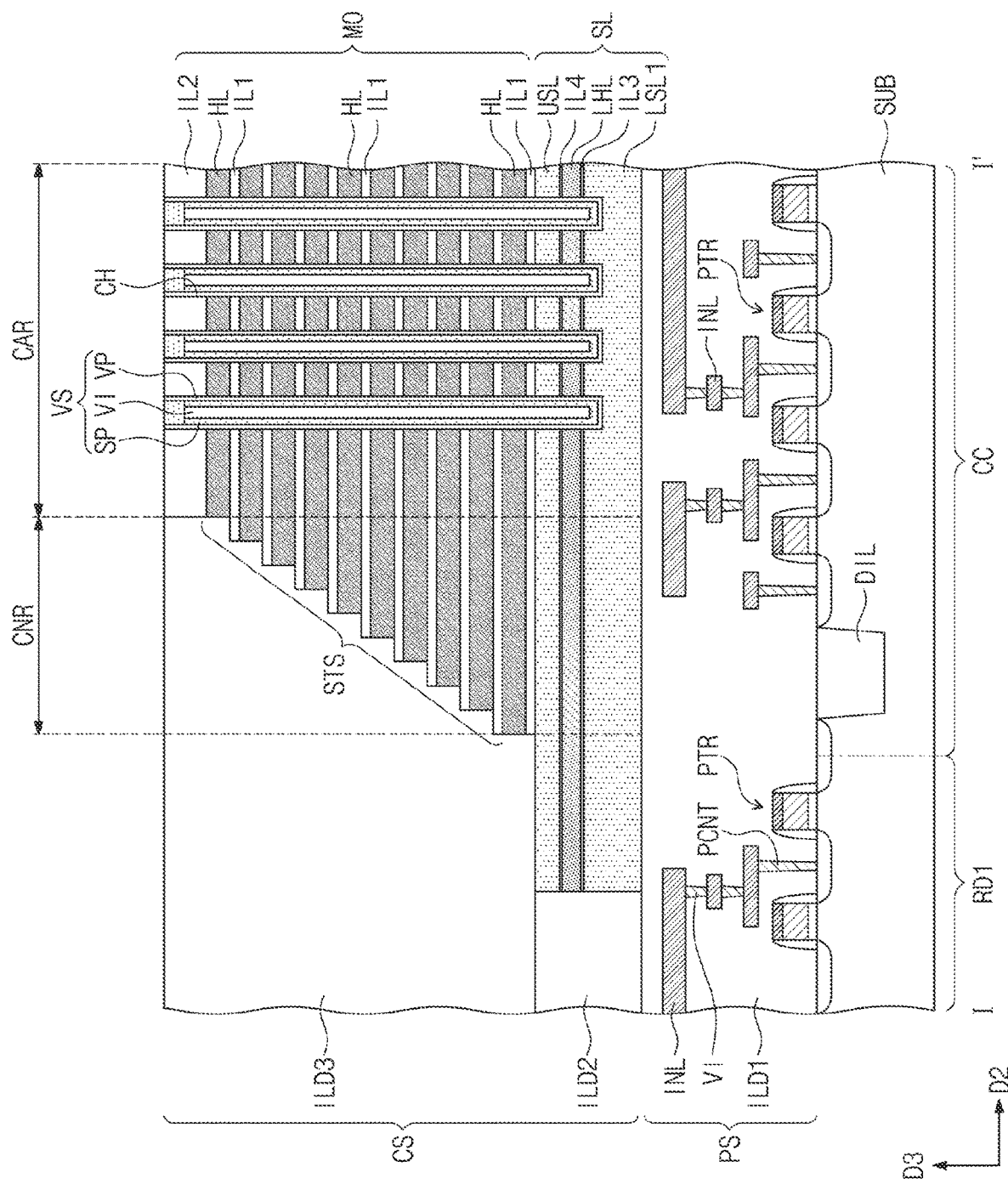

THREE-DIMENSIONAL (3D) SEMICONDUCTOR MEMORY DEVICE

CROSS-REFERENCE TO RELATED APPLICATION

This application is a continuation of U.S. application Ser. No. 17/983,024, filed Nov. 8, 2022, which is a continuation of U.S. application Ser. No. 17/095,821, filed Nov. 12, 2020, now U.S. Pat. No. 11,521,981, which claims priority under 35 U.S.C. § 119 to Korean Patent Application No. 10-2020-0059307, filed on May 18, 2020, in the Korean Intellectual Property Office, the disclosures of each are hereby incorporated by reference in their entireties.

BACKGROUND

Embodiments of the inventive concept relate generally to semiconductor devices. More particularly, embodiments of the inventive concept relate to three-dimensional (3D) semiconductor memory devices having improved design efficiency.

Semiconductor devices have been highly integrated to provide excellent performance and low manufacturing costs. The integration density of semiconductor devices directly affects the costs of the semiconductor devices, thereby resulting in a demand of highly integrated semiconductor devices. The integration density of typical two-dimensional (2D) or planar semiconductor devices may be mainly determined by an area where a unit memory cell occupies. Therefore, the integration density of the typical 2D semiconductor devices may be greatly affected by a technique of forming fine patterns. However, since extremely high-priced apparatuses are needed to form fine patterns, the integration density of 2D semiconductor devices continues to increase but is still limited. Thus, three-dimensional (3D) semiconductor memory devices have been developed to overcome the above limitations. 3D semiconductor memory devices may include memory cells three-dimensionally arranged.

SUMMARY

Embodiments of the inventive concept provide a three-dimensional (3D) semiconductor memory device having improved design efficiency.

According to an aspect of the inventive concept, a 3D semiconductor memory device may include; a peripheral circuit structure including a first row decoder region, a second row decoder region, and a control circuit region between the first row decoder region and the second row decoder region, a first electrode structure and a second electrode structure on the peripheral circuit structure, wherein the first electrode structure and the second electrode structure are spaced apart in a first direction and each respectively includes stacked electrodes, a mold structure on the peripheral circuit structure, wherein the mold structure is disposed between the first electrode structure and the second electrode structure and includes stacked sacrificial layers, vertical channel structures penetrating the first electrode structure and the second electrode structure, a separation insulating pattern provided between the first electrode structure and the mold structure and penetrating the mold structure, and a separation structure intersecting the first electrode structure in the first direction and extending to the separation insulating pattern, wherein a maximum width of the separation insulating pattern in a second direction is greater than a maximum width of the separation structure in the second direction.

According to an aspect of the inventive concept, a 3D semiconductor memory device may include; a substrate, an electrode structure including electrodes stacked on the substrate, a mold structure intersecting the electrode structure and extending in a first direction, the mold structure dividing the electrode structure into a first electrode structure and a second electrode structure in a second direction and extending in the first direction, vertical channel structures penetrating the first electrode structure and the second electrode structure, a separation insulating pattern provided between the first electrode structure and the mold structure, and penetrating the mold structure, and a separation structure intersecting the first electrode structure in the second direction and extending to the separation insulating pattern, wherein the mold structure comprises stacked sacrificial layers respectively disposed at same levels as the stacked electrodes, and an end of the separation structure is surrounded by the separation insulating pattern when viewed in plan.

According to an aspect of the inventive concept, a 3D semiconductor memory device may include; a first substrate, a peripheral circuit structure on the first substrate, the peripheral circuit structure including a first row decoder region, a second row decoder region, and a control circuit region between the first row decoder region and the second row decoder region, a second substrate on the peripheral circuit structure, the second substrate including a first semiconductor layer and a second semiconductor layer, a first electrode structure and a second electrode structure respectively provided on the first semiconductor layer and the second semiconductor layer, wherein the first electrode structure and the second electrode structure are spaced apart in a first direction and respectively include comprises stacked electrodes, the first electrode structure having a stair-stepped structure adjacent to the first row decoder region, and the second electrode structure having a stair-stepped structure adjacent to the second row decoder region, a mold structure on the peripheral circuit structure, the mold structure disposed between the first electrode structure and the second electrode structure, and the mold structure including stacked sacrificial layers, a first vertical channel structure penetrating the first electrode structure to connect the first semiconductor layer, a second vertical channel structure penetrating the second electrode structure to connect the second semiconductor layer, a separation insulating pattern provided between the first electrode structure and the mold structure and penetrating the mold structure, a separation structure intersecting the first electrode structure in the first direction and extending to the separation insulating pattern, the separation structure dividing the electrode of the first electrode structure into segments in a second direction, an interlayer insulating layer covering the first electrode structure and the second electrode structure, bit lines provided on the interlayer insulating layer and electrically connected to the first vertical channel structure and the second vertical channel structure and upper interconnection lines electrically connected to the stair-stepped structure of the first electrode structure and the stair-stepped structure of the second electrode structure. Each of the first vertical channel structure and the second vertical channel structure may include; a vertical semiconductor pattern vertically extending from the second substrate and a data storage layer disposed between the vertical semiconductor pattern and the stacked electrodes. The control circuit region may include a first peripheral transistor provided under the first electrode structure, a second peripheral transistor provided under the second electrode structure, and a lower interconnection line crossing under the mold structure, and the first peripheral transistor electrically connecting the second peripheral transistor through the lower interconnection line.

BRIEF DESCRIPTION OF THE DRAWINGS

The inventive concept will become more apparent upon consideration of the following detailed description with reference to the accompanying drawings.

FIGS. 4A to 8E illustrate a method of manufacturing a 3D semiconductor memory device according to embodiments of the inventive concept, wherein FIGS. 4A, 5A, 6A, 7A and 8A are cross-sectional views taken along the line I-I' of FIG. 2; FIG. 8E is a cross-sectional view taken along the line V-V' of FIG. 2.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: first/second/third directions; height/width; vertical/horizontal; top/bottom; higher/lower, closer/farther, thicker/thinner; proximate/distant; above/below; under/over; upper/lower; center/side; surrounding; overlay/underlay; etc.

Figure 1:
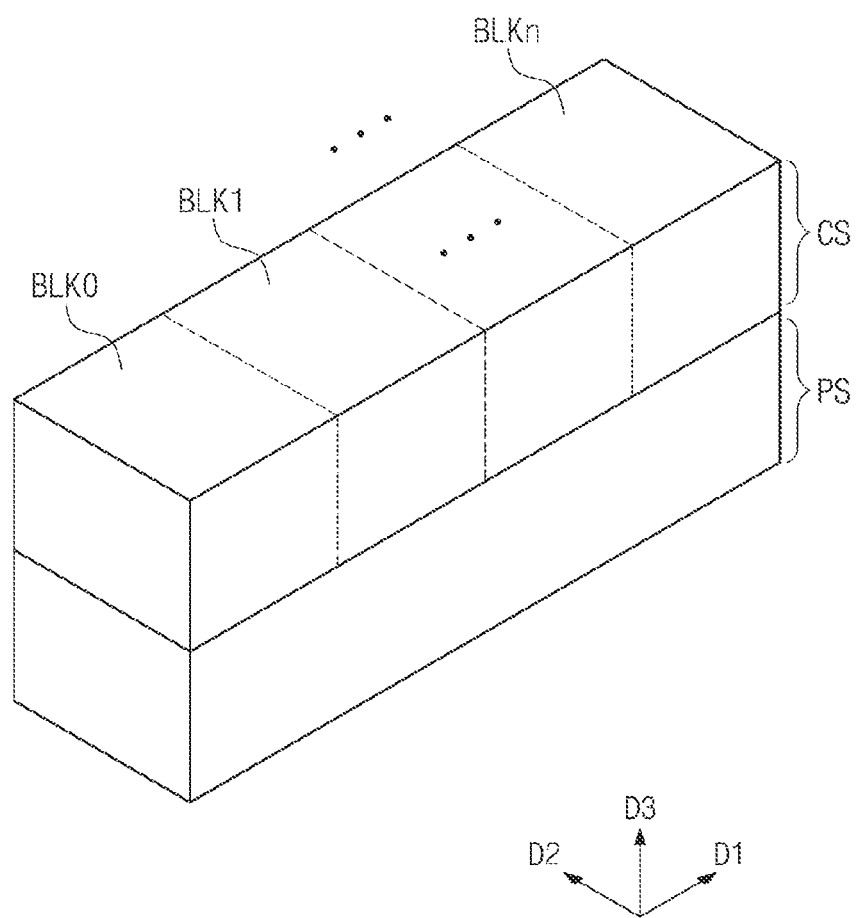
FIG. 1 is a perspective view illustrating a three-dimensional (3D) semiconductor memory device according to embodiments of the inventive concept.

FIG. 1 is a perspective view illustrating a three-dimensional (3D) semiconductor memory device according to embodiments of the inventive concept.

Referring to FIG. 1, the 3D semiconductor memory device may include a peripheral circuit structure PS, a cell array structure CS on the peripheral circuit structure PS, and through-contact(s) (not shown) vertically connecting the cell array structure CS and the peripheral circuit structure PS. Here, the cell array structure CS may overlap, at least on part, with the peripheral circuit structure PS when viewed in plan (i.e., when viewed from a top-down perspective).

In some embodiments, the peripheral circuit structure PS may include a row decoder, a page buffer and various control circuits. Peripheral logic circuits constituting the peripheral circuit structure PS may be integrated on a semiconductor substrate.

The cell array structure CS may include a cell array including a plurality of memory cells three-dimensionally arranged. For example, the cell array structure CS may include a plurality of memory blocks BLK0 to BLKn. Each of the memory blocks BLK0 to BLKn may include three-dimensionally arranged memory cells.

Figure 2:
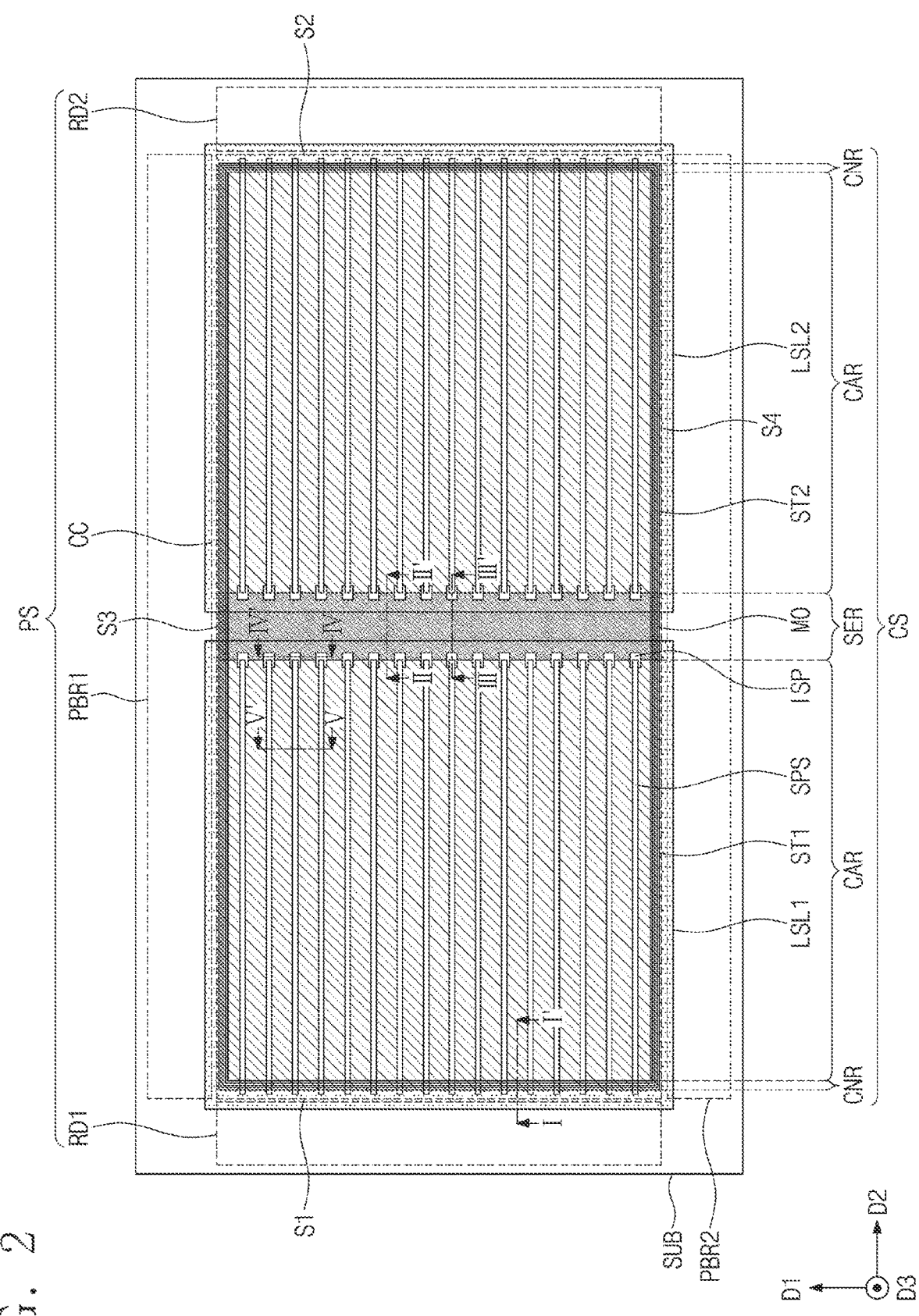
FIG. 2 is a plan (or top-down) view illustrating a 3D semiconductor memory device according to embodiments of the inventive concept.

FIG. 2 is a plan view illustrating a 3D semiconductor memory device according to embodiments of the inventive concept. FIGS. 3A, 3B, 3C, 3D and 3E (hereafter collectively. "FIGS. 3A to 3E") are cross-sectional views variously taken along the lines I-I', II-II', III-III', IV-IV' and V-V' of FIG. 2.

Referring to FIG. 2, the peripheral circuit structure PS and the cell array structure CS described with reference to FIG. 1 may be disposed on a first substrate SUB. The cell array structure CS may be provided on the peripheral circuit structure PS.

In some embodiments, the peripheral circuit structure PS on the first substrate SUB may include a first row decoder region RD1, a second row decoder region RD2, a first page buffer region PBR1, a second page buffer region PBR2, and a control circuit region CC. The control circuit region CC may be disposed between the first and second row decoder regions RD1 and RD2 and between the first and second page buffer regions PBR1 and PBR2.

The control circuit region CC may include a first side S1 and an opposing second side S2 extending in a second direction D2 (e.g., a second lateral direction substantially parallel with a primary surface of the first substrate). The first and second sides S1 and S2 may extend in a first direction D1 (e.g., a first lateral direction intersecting the second lateral direction). The control circuit region CC may also include a third side S3 and an opposing fourth side S4 extending in the first direction D1. The third and fourth sides S3 and S4 may extend in the second direction D2.

The first and second row decoder regions RD1 and RD2 may be provided adjacent to the first and second sides S1 and S2 of the control circuit region CC, respectively. The first and second page buffer regions PBR1 and PBR2 may be provided adjacent to the third and fourth sides S3 and S4 of the control circuit region CC, respectively.

The cell array structure CS on the peripheral circuit structure PS may include a first lower semiconductor layer LSL1 and a second lower semiconductor layer LSL2. The first and second lower semiconductor layers LSL1 and LSL2 may be spaced apart in the second direction D2. The first and second lower semiconductor layers LSL1 and LSL2 may be provided on the control circuit region CC and may vertically overlap with the control circuit region CC. Each of the first and second lower semiconductor layers LSL1 and LSL2 may have a quadrilateral plate shape when viewed in plan.

The cell array structure CS may further include a first electrode structure ST1, a second electrode structure ST2, and a mold structure MO disposed between the first and second electrode structures ST1 and ST2. The first and second electrode structures ST1 and ST2 may be provided on the first and second lower semiconductor layers LSL1 and LSL2, respectively. The first and second electrode structures ST1 and ST2 may be spaced apart in the second direction D2. The mold structure MO may be disposed between the first and second electrode structures ST1 and ST2 to connect the first and second electrode structures ST1 and ST2. Each of the first and second electrode structures ST1 and ST2 may include the memory blocks BLK0 to BLKn described above with reference to FIG. 1.

A plurality of separation structures SPS may intersect each of the first and second electrode structures ST1 and ST2 and may extend in the second direction D2. Each of the separation structures SPS may have a line shape when viewed in plan.

A plurality of separation insulating patterns ISP may be arranged in the first direction D1 along a boundary between the first electrode structure ST1 and the mold structure MO. A plurality of separation insulating patterns ISP may be arranged in the first direction D1 along a boundary between the second electrode structure ST2 and the mold structure MO.

Each of the separation insulating patterns ISP may be provided at an end of the separation structure SPS. That is, an end of the separation structure SPS may overlap with the separation insulating pattern ISP. A width of the separation insulating pattern ISP in the first direction D1 may be greater than a width of the separation structure SPS in the first direction D1.

In some embodiments, the cell array structure CS may have connection regions CNR, cell array regions CAR, and a separation region SER between the cell array regions CAR. Each of the first and second electrode structures ST1 and ST2 may be provided in the connection region CNR and the cell array region CAR. The mold structure MO may be provided in the separation region SER.

According to some embodiments, the peripheral logic circuits constituting the peripheral circuit structure PS may be freely disposed under the cell array structure CS.

A 3D semiconductor memory device according to embodiments of the inventive concept will be described in some additional detail with reference to FIGS. 2 and 3A to 3E. The peripheral circuit structure PS including peripheral transistors PTR may be disposed on the first substrate SUB. The first substrate SUB may include a silicon substrate, a silicon-germanium substrate, a germanium substrate, or a single-crystalline epitaxial layer grown on a single-crystalline silicon substrate. The first substrate SUB may include active regions defined by a device isolation layer DIL.

The peripheral circuit structure PS may include a plurality of the peripheral transistors PTR disposed on the active regions of the first substrate SUB. The peripheral transistors PTR may be disposed in the first and second row decoder regions RD1 and RD2, the first and second page buffer regions PBR1 and PBR2, and the control circuit region CC.

The peripheral circuit structure PS may include lower interconnection lines INL on the peripheral transistors PTR, and vias VIA vertically connecting the lower interconnection lines INL. A peripheral contact PCNT may be provided between a lowermost one of the lower interconnection lines INL and the peripheral transistor PTR to electrically connect the lowermost lower interconnection line INL and the peripheral transistor PTR.

The peripheral circuit structure PS may further include a first interlayer insulating layer ILD1 covering the peripheral transistors PTR and the lower interconnection lines INL. The first interlayer insulating layer ILD1 may include stacked insulating layers. For example, the first interlayer insulating layer ILD1 may include at least one of a silicon oxide layer, a silicon nitride layer, a silicon oxynitride layer and a low-k dielectric layer.

The cell array structure CS may be provided on the first interlayer insulating layer ILD1 of the peripheral circuit structure PS. Hereinafter, the cell array structure CS will be described in some additional detail.

A second interlayer insulating layer ILD2 and a second substrate SL may be provided on the first interlayer insulating layer ILD1. The second substrate SL may be provided in the second interlayer insulating layer ILD2. For example, the second substrate SL may have a quadrilateral plate shape when viewed in plan. The second substrate SL may support the first and second electrode structures ST1 and ST2 provided thereon.

The second substrate SL may include the first and second lower semiconductor layers LSL1 and LSL2 described above. The second substrate SL may further include a source semiconductor layer SSL and an upper semiconductor layer USL, which are sequentially stacked on each of the first and second lower semiconductor layers LSL1 and LSL2. Each of the first and second lower semiconductor layers LSL1 and LSL2, the source semiconductor layer SSL and the upper semiconductor layer USL may include a semiconductor material (e.g., silicon (Si), germanium (Ge), silicon-germanium (SiGe), gallium-arsenic (GaAs), indium-gallium-arsenic (InGaAs), aluminum-gallium-arsenic (AlGaAs), or any combination thereof). Each of the first and second lower semiconductor layers LSL1 and LSL2, the source semiconductor layer SSL and the upper semiconductor layer USL may be single-crystalline, amorphous and/or poly-crystalline. For example, each of the first and second lower semiconductor layers LSL1 and LSL2, the source semiconductor layer SSL and the upper semiconductor layer USL may include a doped, N-type poly-silicon layer. Dopant concentrations of the lower semiconductor layer LSL1 or LSL2, the source semiconductor layer SSL and the upper semiconductor layer USL may be different from each other.

The source semiconductor layer SSL may be disposed between the lower semiconductor layer LSL1 or LSL2 and the upper semiconductor layer USL. The lower semiconductor layer LSL1 or LSL2 and the upper semiconductor layer USL may be electrically connected to each other through the source semiconductor layer SSL. For example, the upper semiconductor layer USL and the source semiconductor layer SSL may overlap with the lower semiconductor layer LSL1 or LSL2 thereunder when viewed in plan.

Referring again to FIGS. 3B and 3C, a third insulating layer IL3, a lower sacrificial layer LHL and a fourth insulating layer IL4 may be sequentially stacked in the separation region SER. The third insulating layer IL3, the lower sacrificial layer LHL and the fourth insulating layer IL4 may be provided at the same level as the source semiconductor layer SSL. For example, a bottom surface of the third insulating layer IL3 may be coplanar with a bottom surface of the source semiconductor layer SSL, and a top surface of the fourth insulating layer IL4 may be coplanar with a top surface of the source semiconductor layer SSL.

Referring again to FIGS. 2 and 3A to 3E, the first electrode structure ST1 and the second electrode structure ST2 may be provided on the second substrate SL. Each of the first and second electrode structures ST1 and ST2 may include electrodes EL stacked in a third direction D3 (e.g., a vertical direction substantially orthogonal to the first direction D1 and the second direction D2) on the second substrate SL. Each of the first and second electrode structures ST1 and ST2 may further include first insulating layers IL1 separating the stacked electrodes EL from each other. The first insulating layers IL1 and the electrodes EL may be alternately stacked in the third direction D3.

Each of the first and second electrode structures ST1 and ST2 may extend from the cell array region CAR into the connection region CNR. Each of the first and second electrode structures ST1 and ST2 may have a stair-stepped structure STS in the connection region CNR. A height of the stair-stepped structure STS may decrease as a distance from the cell array region CAR increases.

In each of the first and second electrode structures ST1 and ST2, a lowermost electrode EL may be a lower selection line. An uppermost electrode EL may be an upper selection line. The other electrodes EL except the lower and upper selection lines may be word lines.

The electrodes EL may include a conductive material. For example, the electrodes EL may include at least one of a doped semiconductor material (e.g., doped silicon), a metal (e.g., tungsten, copper, or aluminum), a conductive metal nitride (e.g., titanium nitride or tantalum nitride) and a transition metal (e.g., titanium or tantalum). In certain embodiments, each of the first insulating layers IL1 may include a silicon oxide layer.

Each of the first and second electrode structures ST1 and ST2 may further include a second insulating layer IL2. The second insulating layer IL2 may be selectively provided in the cell array region CAR but may not be provided in the connection region CNR. A thickness of the second insulating layer IL2 may be greater than a thickness of the first insulating layer IL1. The second insulating layer IL2 may include the same insulating material as the first insulating layer IL1. In certain embodiments, the second insulating layer IL2 may include a silicon oxide layer.

A plurality of vertical channel structures VS penetrating the first and second electrode structures ST1 and ST2 may be provided in the cell array region CAR. The vertical channel structures VS may be arranged in the second direction D2. Each of the vertical channel structures VS may include a vertical insulating pattern VP, a vertical semiconductor pattern SP, and a filling insulation pattern VI. The vertical semiconductor pattern SP may be disposed between the vertical insulating pattern VP and the filling insulation pattern VI. A conductive pad (PAD) may be provided in an upper portion of each of the vertical channel structures VS.

The filling insulation pattern VI may have a cylindrical shape. The vertical semiconductor pattern SP may cover an outer surface of the filling insulation pattern VI and may extend from the lower semiconductor layer LSL1 or LSL2 to the conductive pad in the third direction D3. The vertical semiconductor pattern SP may have a pipe shape having an opened top end. The vertical insulating pattern VP may cover an outer surface of the vertical semiconductor pattern SP and may extend from the lower semiconductor layer LSL1 or LSL2 to a top surface of the second insulating layer IL2 in the third direction D3. The vertical insulating pattern VP may have a pipe shape having an opened top end. The vertical insulating pattern VP may be disposed between the electrode structure ST1 or ST2 and the vertical semiconductor pattern SP.

The vertical insulating pattern VP may be formed of a single layer or a multi-layer. In certain embodiments, the vertical insulating pattern VP may include a data storage layer. For example, the vertical insulating pattern VP may be a data storage layer of a NAND flash memory device and may include a tunnel insulating layer, a charge storage layer and a blocking insulating layer.

For example, the charge storage layer may include a trap insulating layer, a floating gate electrode, and/or an insulating layer including conductive nano dots. The charge storage layer may include at least one of a silicon nitride layer, a silicon oxynitride layer, a silicon-rich nitride layer, a nano-crystalline silicon layer, or a laminated trap layer. The tunnel insulating layer may include a material of which an energy band gap is greater than that of the charge storage layer. For example, the tunnel insulating layer may include at least one of a high-k dielectric layer (e.g., an aluminum oxide layer or a hafnium oxide layer) and a silicon oxide layer. Here, the blocking insulating layer may include a silicon oxide layer.

The vertical semiconductor pattern SP may include a semiconductor material such as silicon (Si), germanium (Ge), or a combination thereof. The vertical semiconductor pattern SP may include a doped semiconductor material, or an undoped, intrinsic semiconductor material. The vertical semiconductor pattern SP including the semiconductor material may be used as channels of transistors constituting a NAND cell string.

The conductive pad (PAD) may cover a top surface of the vertical semiconductor pattern SP and a top surface of the filling insulation pattern VI. The conductive pad may include a doped semiconductor material and/or a conductive material. A bit line contact plug BPLG may be electrically connected to the vertical semiconductor pattern SP through the conductive pad.

The source semiconductor layer SSL may be in direct contact with a sidewall of a lower portion of each of the vertical semiconductor patterns SP. The source semiconductor layer SSL may electrically connect a plurality of the vertical semiconductor patterns SP to each other. That is, the vertical semiconductor patterns SP may be electrically connected to the second substrate SL. The second substrate SL may function as sources of memory cells. A common source voltage may be applied to the second substrate SL.

The 3D semiconductor memory device according to embodiments may be a 3D NAND flash memory device. NAND cell strings may be integrated at the electrode structures ST1 and ST2 on the lower semiconductor layers LSL1 and LSL2. That is, the first and second electrode structures ST1 and ST2 and the vertical channel structures VS penetrating them may constitute memory cells three-dimensionally arranged on the second substrate SL. The electrodes EL of the first and second electrode structures ST1 and ST2 may be used as gate electrodes of memory transistors (i.e., the memory cells).

The mold structure MO may be provided in the separation region SER. The mold structure MO may be disposed between the first and second electrode structures ST1 and ST2 to physically connect the first and second electrode structures ST1 and ST2. The mold structure MO may extend in the first direction D1 between the first and second electrode structures ST1 and ST2 when viewed in plan.

The mold structure MO may include sacrificial layers HL stacked in the third direction D3 on the second interlayer insulating layer ILD2. The first insulating layers IL1 may extend between the stacked sacrificial layers HL to separate the sacrificial layers HL from each other. That is, the first insulating layers IL1 and the sacrificial layers HL of the mold structure MO may be alternately stacked in the third direction D3. The second insulating layer IL2 may be provided in an uppermost portion of the mold structure MO.

The mold structure MO may share the first and second insulating layers IL1 and IL2 with the first and second electrode structures ST1 and ST2.

The sacrificial layers HL may be provided at the same levels as the electrodes EL of the first and second electrode structures ST1 and ST2, respectively. That is, the sacrificial layer HL of the mold structure MO may physically connect the electrode EL of the first electrode structure ST1 and the electrode EL of the second electrode structure ST2. The sacrificial layers HL may include an insulating material such as silicon nitride or silicon oxynitride. Since the first insulating layers IL1, the second insulating layer IL2 and the sacrificial layers HL are formed of the insulating materials, the mold structure MO may be an insulator.

Figure 3A:
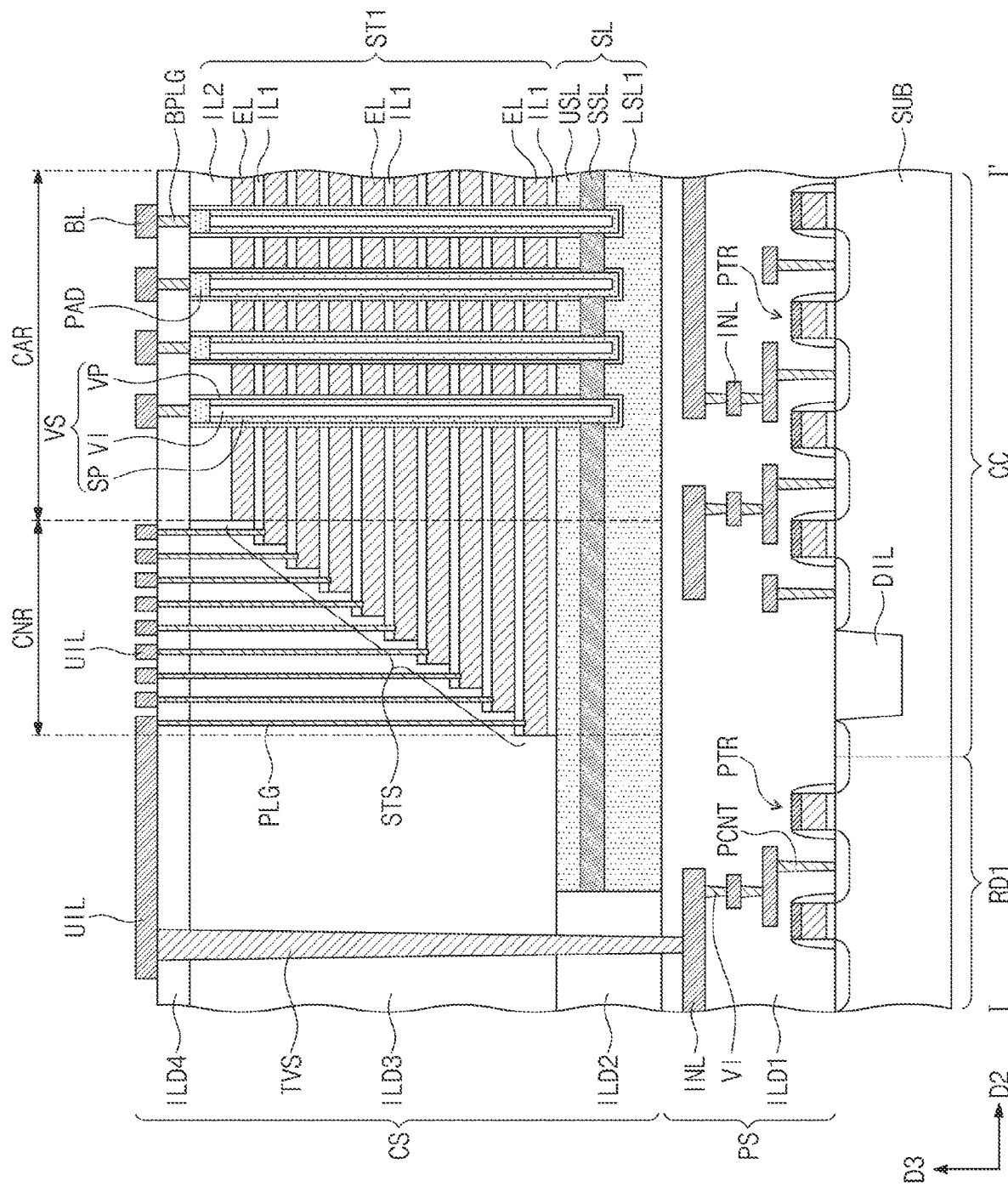
FIGS. 3A, 3B, 3C, 3D and 3E are cross-sectional views respectively taken along lines I-I', II-II', III-III', IV-IV' and V-V' of FIG. 2.
Figure 3B:
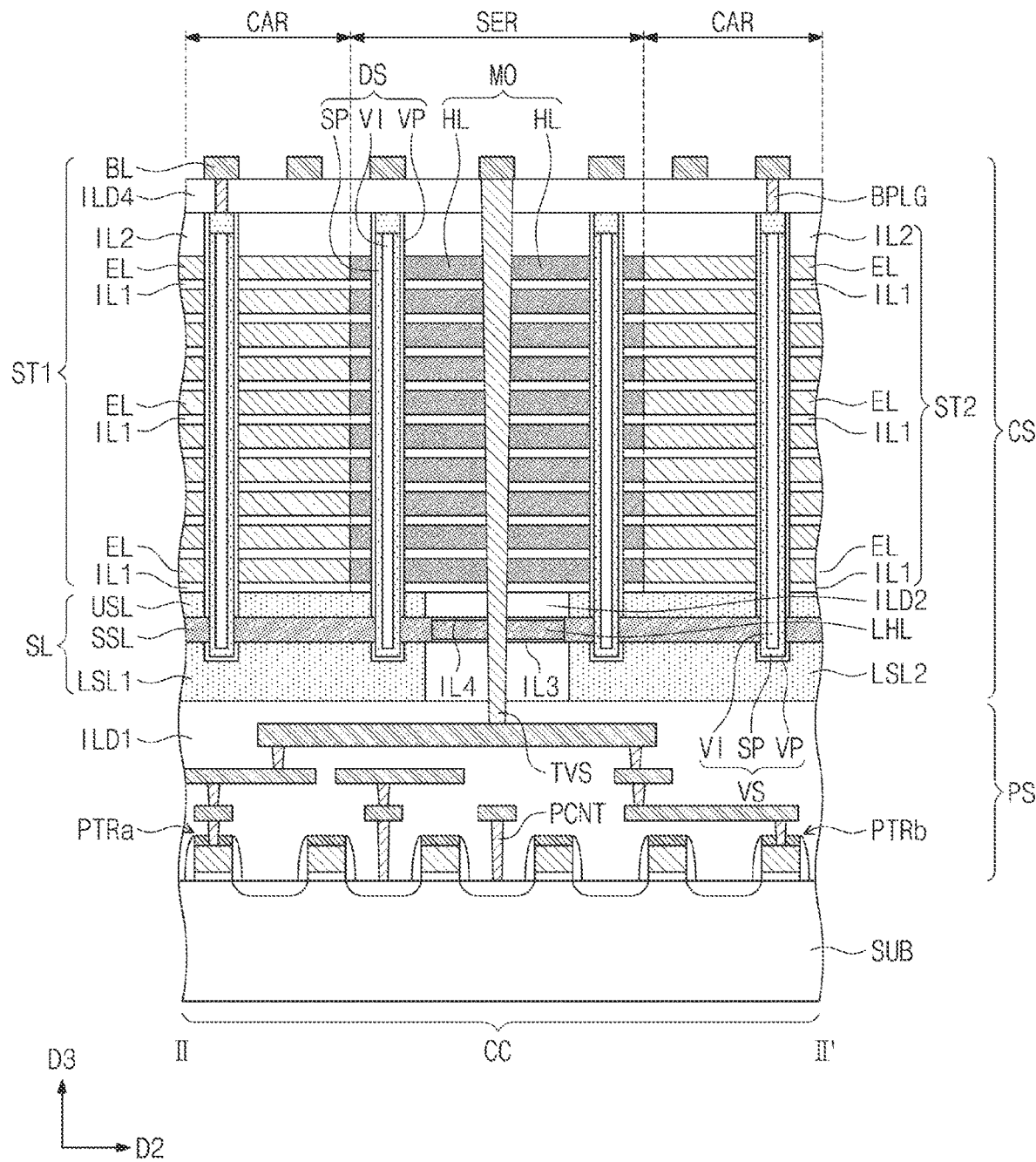

Referring to FIG. 3B, dummy structures DS penetrating the mold structure MO may be provided in the separation region SER. The dummy structure DS may include a vertical insulating pattern VP, a vertical semiconductor pattern SP, and a filling insulation pattern VI, like the vertical channel structure VS described above. However, the dummy structure DS may not function as channels of memory cells, unlike the vertical channel structure VS. The dummy structure DS is not electrically connected to bit lines BL and upper interconnection lines UIL, as described hereafter. That is, the dummy structure DS is just that, a dummy structure that does not perform circuit functions. However, the dummy structures DS may function as pillars (i.e., supporters) that physically support, at least in part, the mold structure MO.

A third interlayer insulating layer ILD3 may be provided on the second substrate SL. The third interlayer insulating layer ILD3 may cover the stair-stepped structures STS of the first and second electrode structures ST1 and ST2. A fourth interlayer insulating layer ILD4 may be provided on the third interlayer insulating layer ILD3.

A plurality of the separation structures SPS may penetrate each of the first and second electrode structures ST1 and ST2. The separation structures SPS may be arranged in parallel and extend in the second direction D2. For example, one electrode EL may be horizontally divided into a plurality of electrodes EL by the separation structures SPS. (See, e.g., FIG. 3E). The plurality of electrodes EL divided by the separation structures SPS may be arrange din parallel and extend in the second direction D2.

The separation structure SPS may penetrate the electrode structure ST1 or ST2 to extend to the lower semiconductor layer LSL1 or LSL2. The separation structure SPS may include an insulating material such as silicon oxide.

Figure 3C:
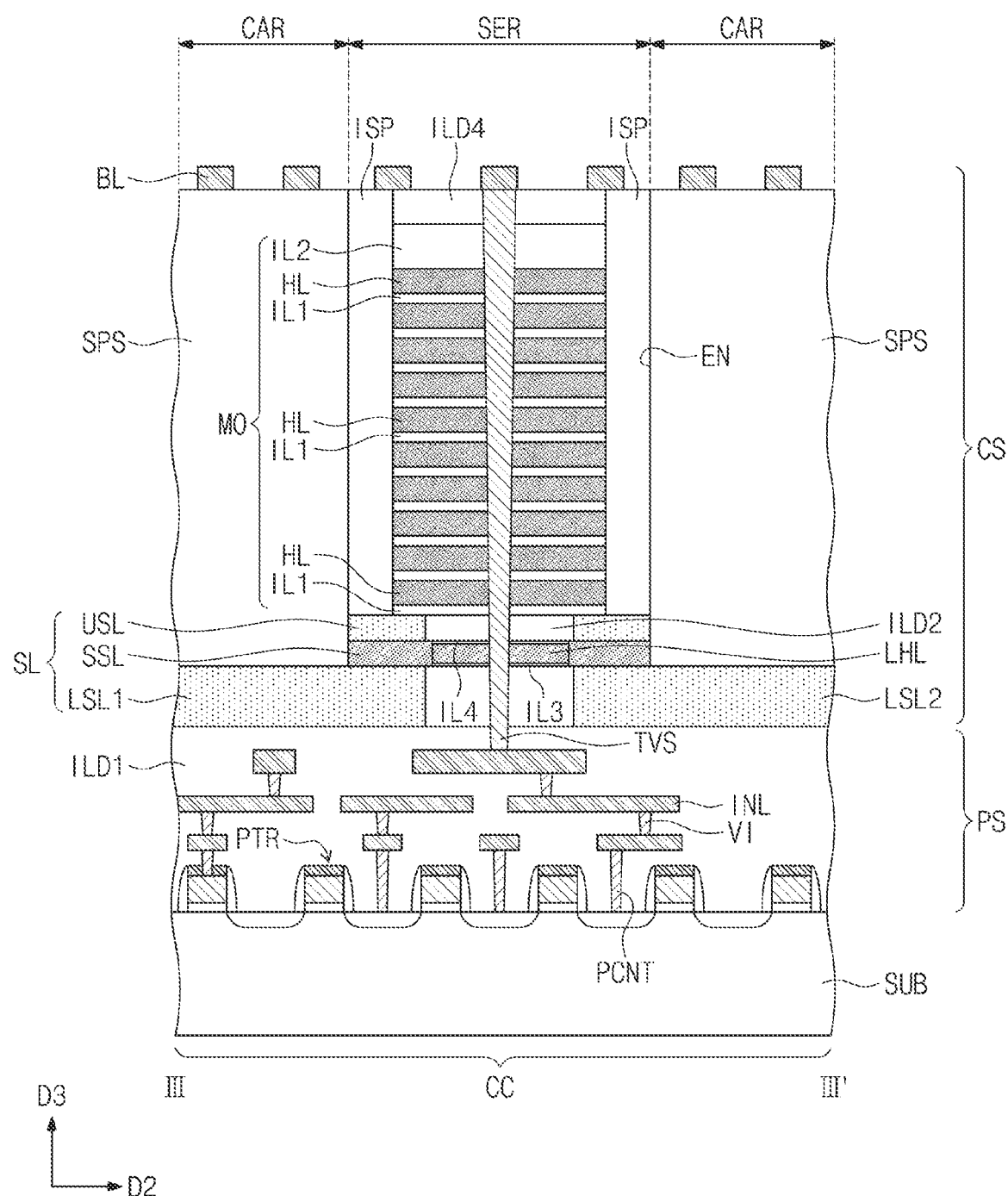

A plurality of the separation insulating patterns ISP may penetrate the mold structure MO. Referring to FIG. 3C, the separation insulating pattern ISP may contact with an end EN of the separation structure SPS extending to the mold structure MO. The separation insulating pattern ISP may penetrate the mold structure MO but may not extend to the lower semiconductor layer LSL1 or LSL2. That is, a bottom surface of the separation insulating pattern ISP may be higher than a bottom surface of the separation structure SPS. Meanwhile, a top surface of the separation insulating pattern ISP, a top surface of the separation structure SPS and a top surface of the fourth interlayer insulating layer ILD4 may be coplanar.

Figure 3D:
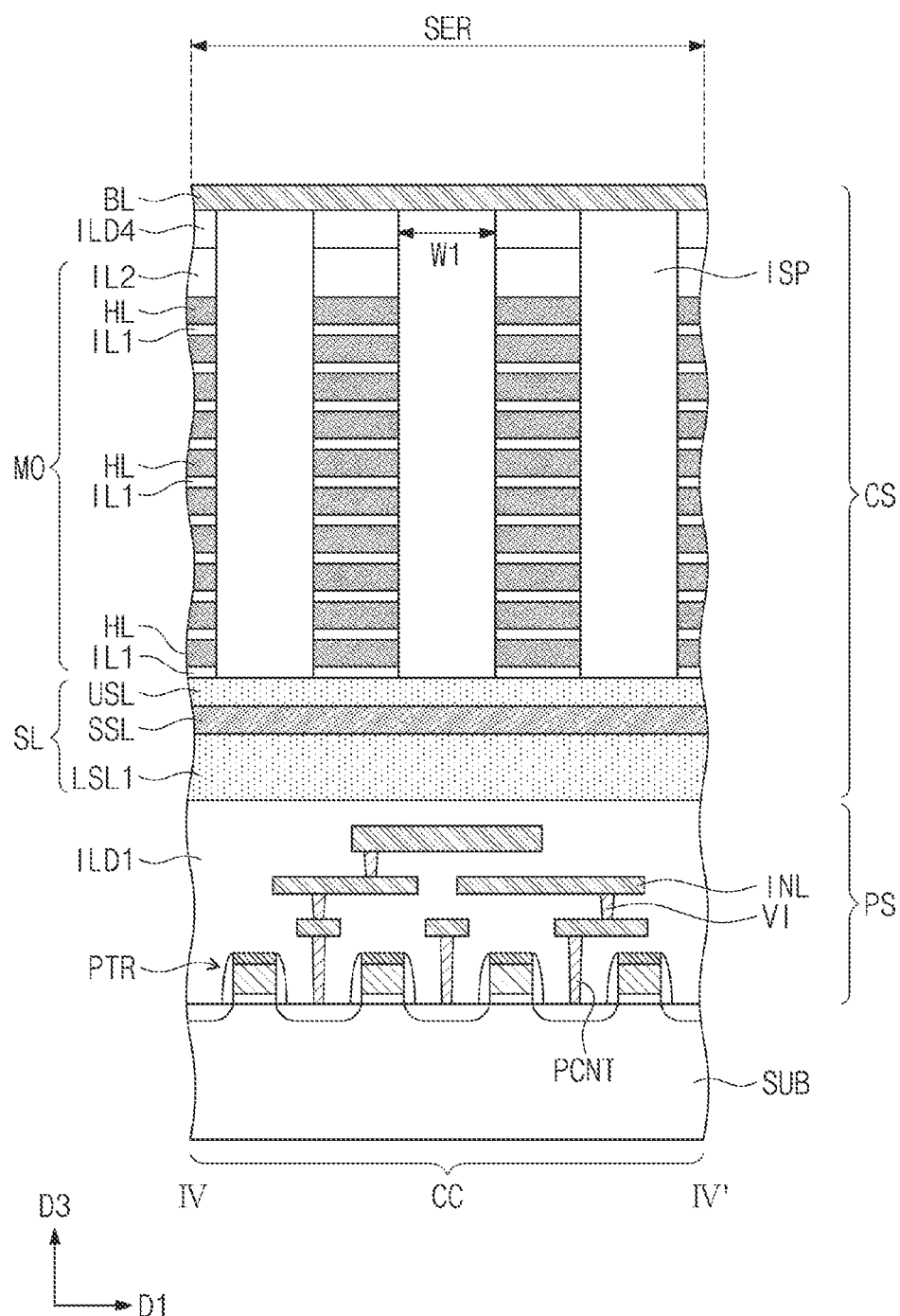
Figure 3E:
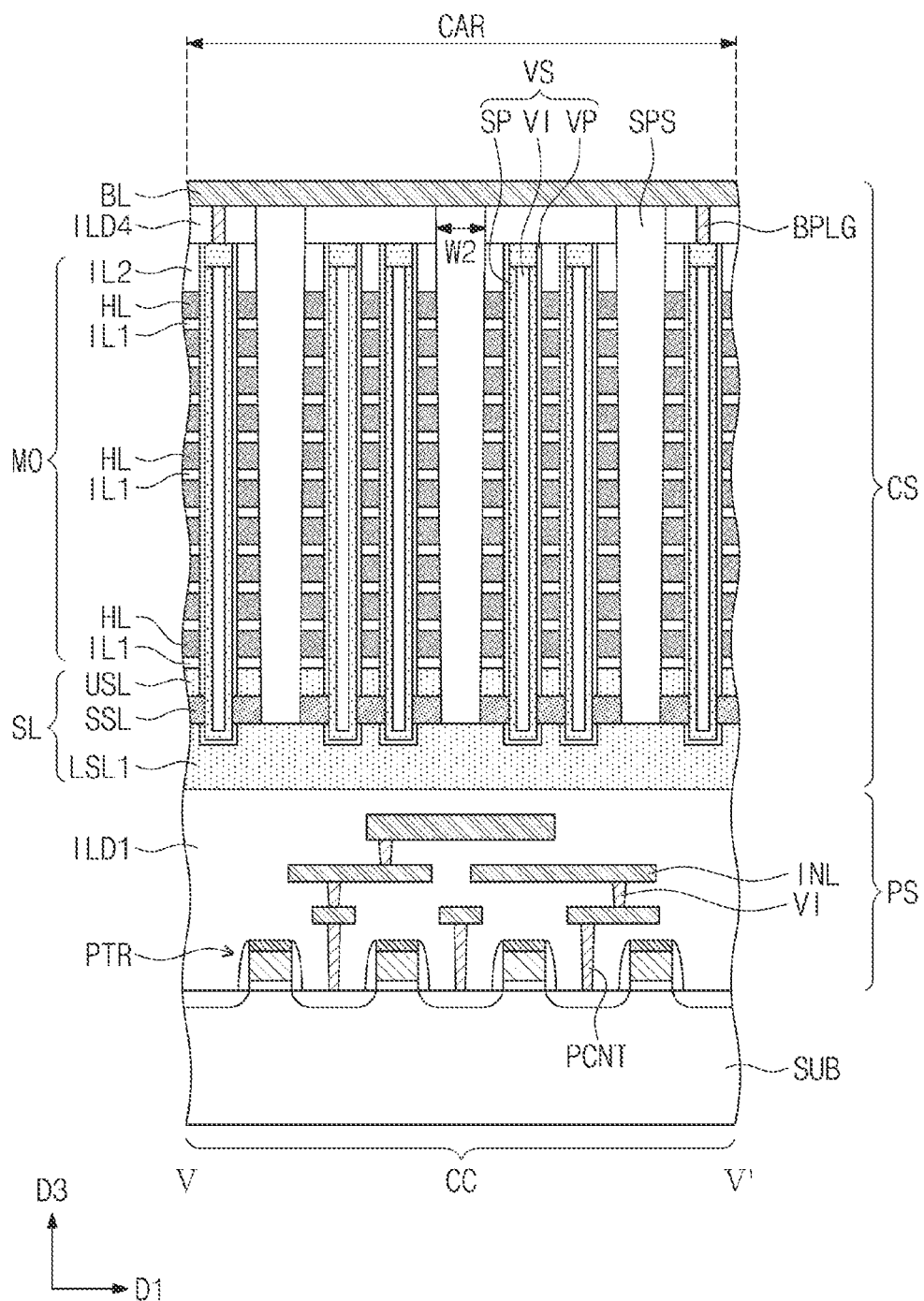

Referring to FIG. 3D, a maximum width of the separation insulating pattern ISP in the first direction D1 may be a first width W1. Referring to FIG. 3E, a maximum width of the separation structure SPS in the first direction D1 may be a second width W2. The first width W1 may be greater than the second width W2. That is, the separation insulating pattern ISP may surround the end of the separation structure SPS, as illustrated in FIG. 2.

Bit line contact plugs BPLG may penetrate the fourth interlayer insulating layer ILD4 so as to be connected to the conductive pads PAD, respectively. A plurality of bit lines BL may be disposed on the fourth interlayer insulating layer ILD4. The bit lines BL may extend in the first direction D1 in parallel to each other. Each of the bit lines BL may be electrically connected to the vertical semiconductor pattern SP through the bit line contact plug BPLG.

Referring to FIG. 3A, a plurality of cell contact plugs PLG may be provided in the connection region CNR. The cell contact plugs PLG may penetrate the third and fourth interlayer insulating layers ILD3 and ILD4 so as to be connected to the electrodes EL constituting the stair-stepped structure STS, respectively. A plurality of upper interconnection lines UIL may be disposed on the fourth interlayer insulating layer ILD4. Each of the upper interconnection lines UIL may be electrically connected to the electrode EL through the cell contact plug PLG.

Referring to FIG. 3A, at least one through-contact TVS may be provided on the first and second row decoder regions RD1 and RD2. The through-contact TVS may penetrate the fourth interlayer insulating layer ILD4, the third interlayer insulating layer ILD3 and the second interlayer insulating layer ILD2 so as to be connected to an uppermost lower interconnection line INL. The first and second row decoder regions RD1 and RD2 may be electrically connected to the upper interconnection line UIL through the through-contact TVS. That is, the electrode EL of the cell array structure CS may be electrically connected to the row decoder of the peripheral circuit structure PS through the through-contact TVS.

In some embodiments, the first and second row decoder regions RD1 and RD2 may include pass transistors. The word lines of the cell array structure CS may be connected to the row decoder through the pass transistors.

Referring to FIGS. 3B and 3C, at least one through-contact TVS may be provided in the separation region SER. The through-contact TVS may penetrate the mold structure MO to connect an uppermost lower interconnection line INL. The control circuit region CC may be electrically connected to the bit line BL through the through-contact TVS.

In some embodiments, the mold structure MO may be provided between the first and second electrode structures ST1 and ST2 to physically support the first and second electrode structures ST1 and ST2. Thus, it is possible to prevent the first and second electrode structures ST1 and ST2 from collapsing or leaning during formation of the electrodes EL in the first and second electrode structures ST1 and ST2.

The first and second electrode structures ST1 and ST2 may be electrically isolated by the mold structure MO. The first row decoder region RD1 may be disposed at one side of the first electrode structure ST1, and the second row decoder region RD2 may be disposed at one side of the second electrode structure ST2. Thus, the first and second electrode structures ST1 and ST2 may operate as memory blocks independent of each other. As a result, the number of the memory blocks may be increased in the 3D semiconductor memory device according embodiments of the inventive concept, and one or more of the memory blocks may be used as a repair block.

In some embodiments, the cell array structure CS may be divided into the first and second electrode structures ST1 and ST2 by the mold structure MO of the separation region SER. Since the mold structure MO is provided in only the cell array structure CS, the peripheral circuit structure PS under the separation region SER may not be affected by the separation region SER but may be maintained in a single circuit structure. As a result, an area occupied by the control circuit region CC may be widened or increased. The control circuit region CC may realize global internal connection(s) under the first and second electrode structures ST1 and ST2. That is, a first peripheral transistor PTRa under the first electrode structure ST1 and a second peripheral transistor PTRb under the second electrode structure ST2 may be electrically connected to each other through the lower interconnection line INL extending or crossing under the mold structure MO. (See, e.g., FIG. 3B). Thus, according to certain embodiments of the inventive concept, design efficiency of the peripheral circuit may be improved.

Figure 7A:
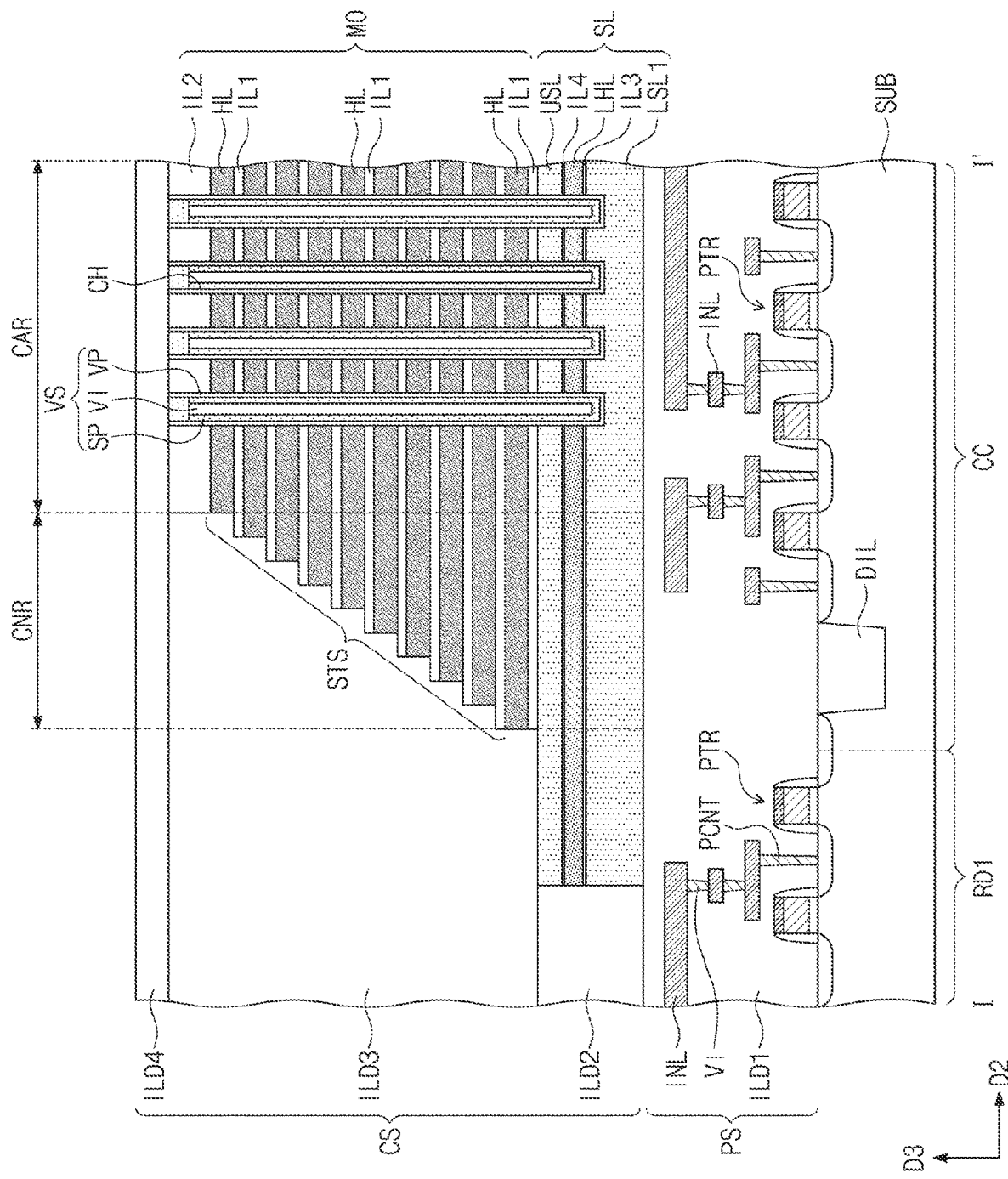
Figure 7B:
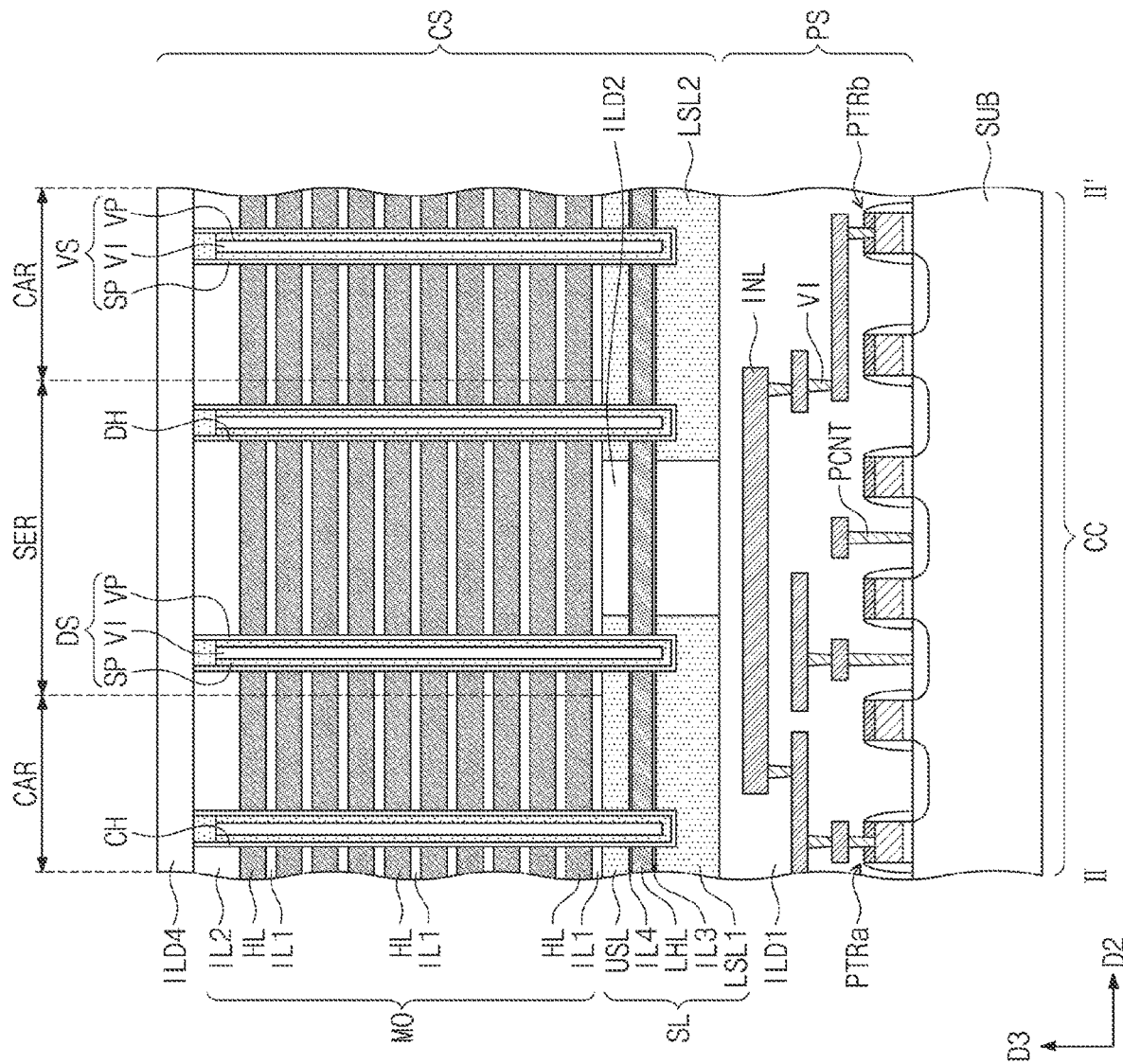
Figure 7C:
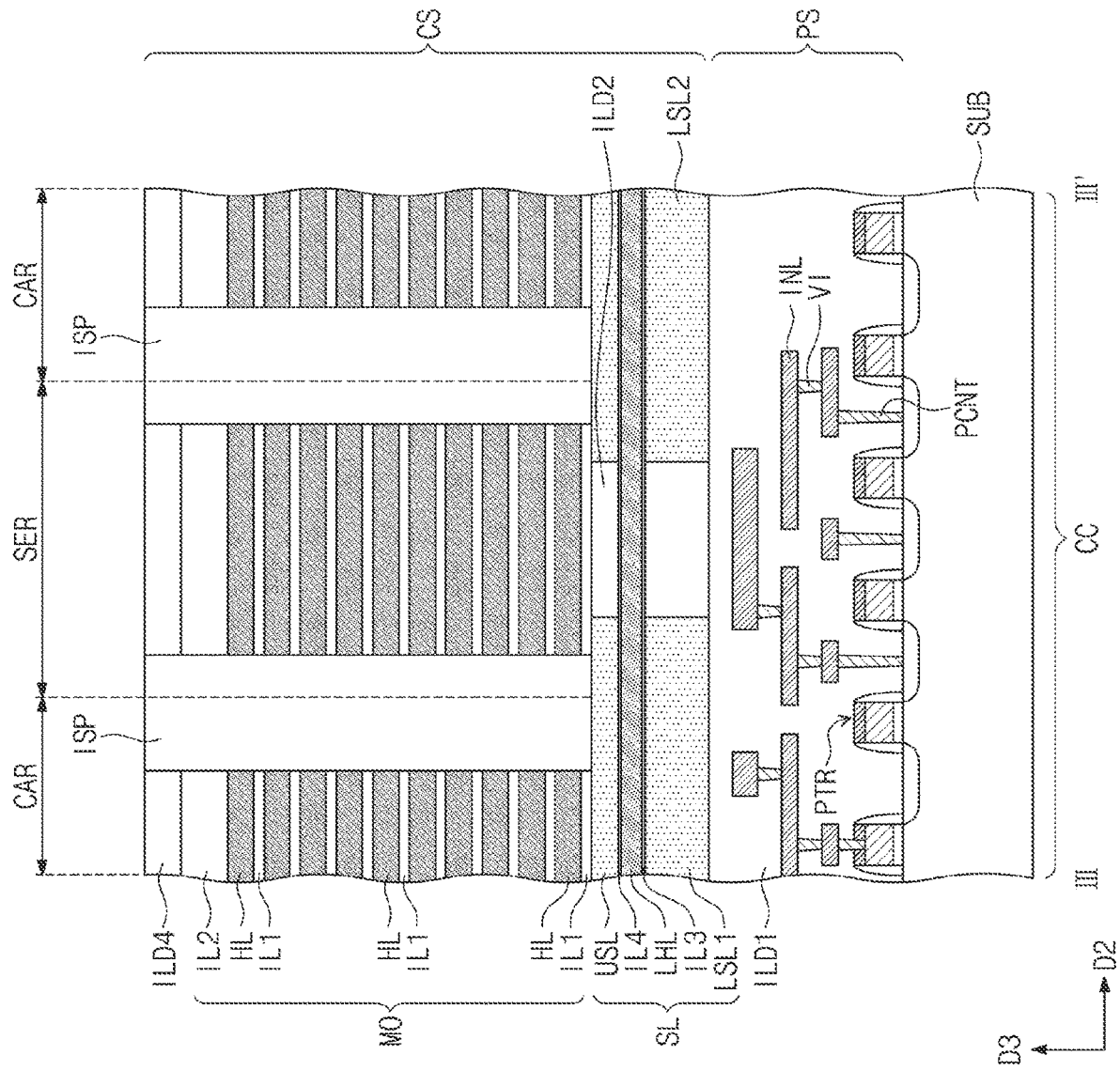
FIGS. 7C and 8C are cross-sectional views taken along the line III-III' of FIG. 2.
Figure 7D:
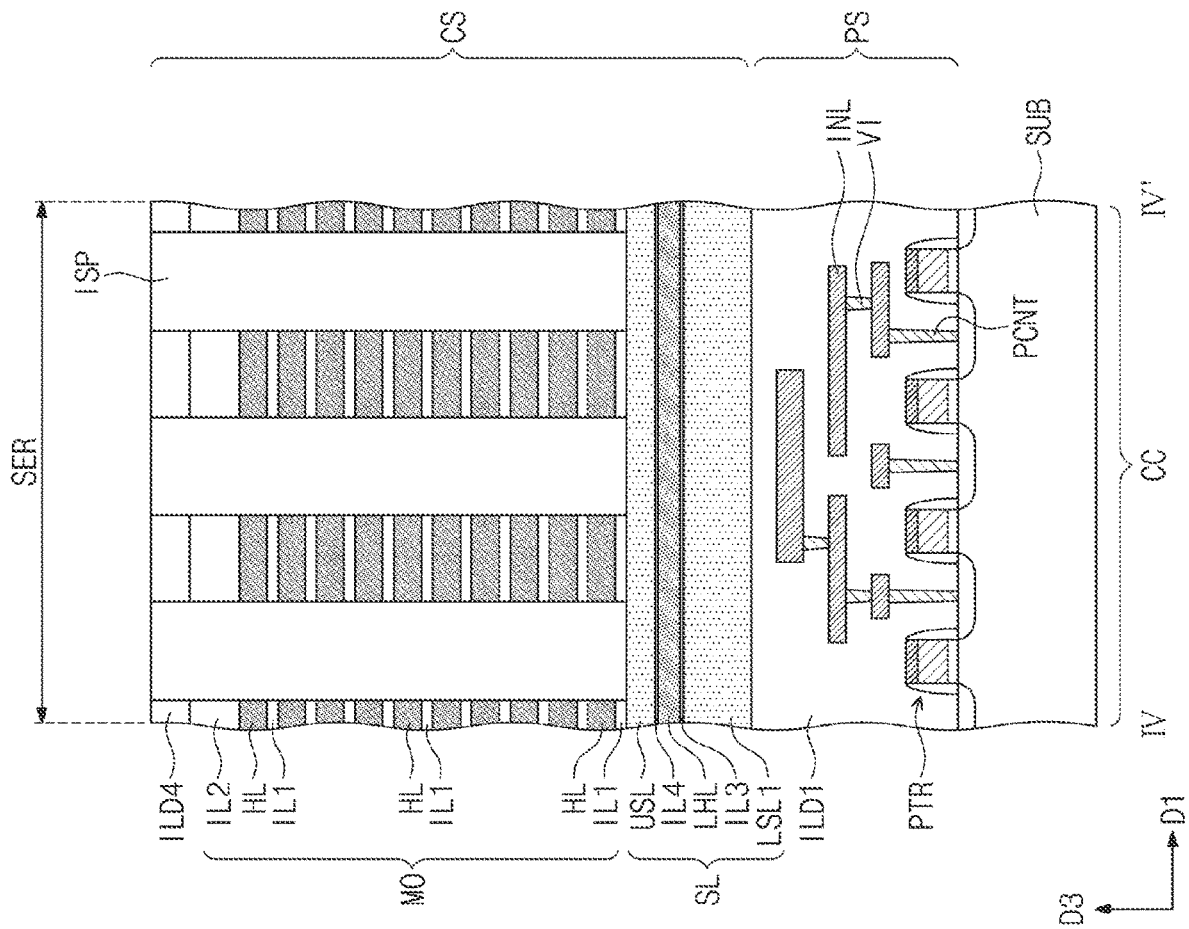
FIGS. 7D and 8D are cross-sectional views taken along the line IV-IV' of FIG. 2.
Figure 8A:
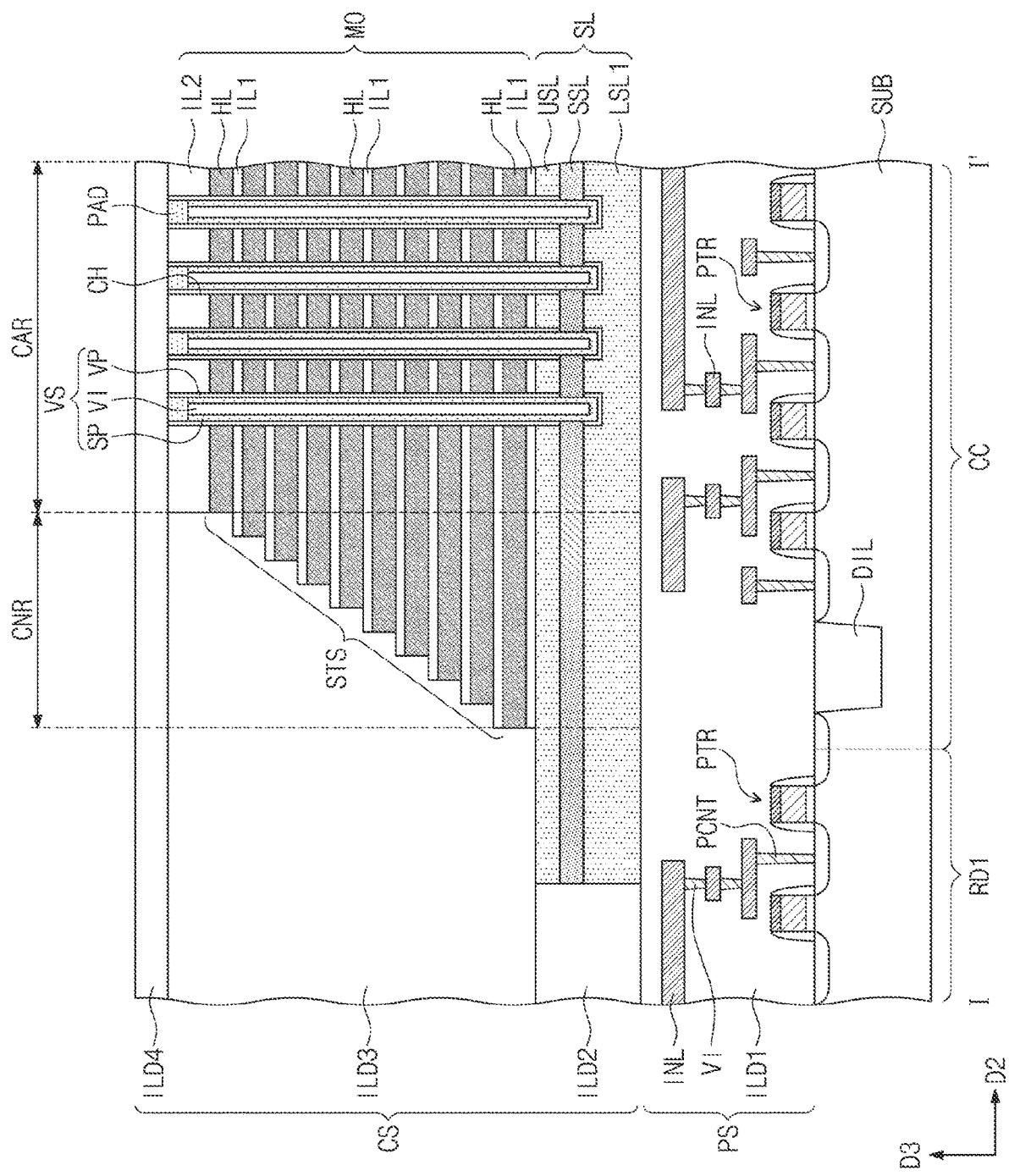
Figure 8B:
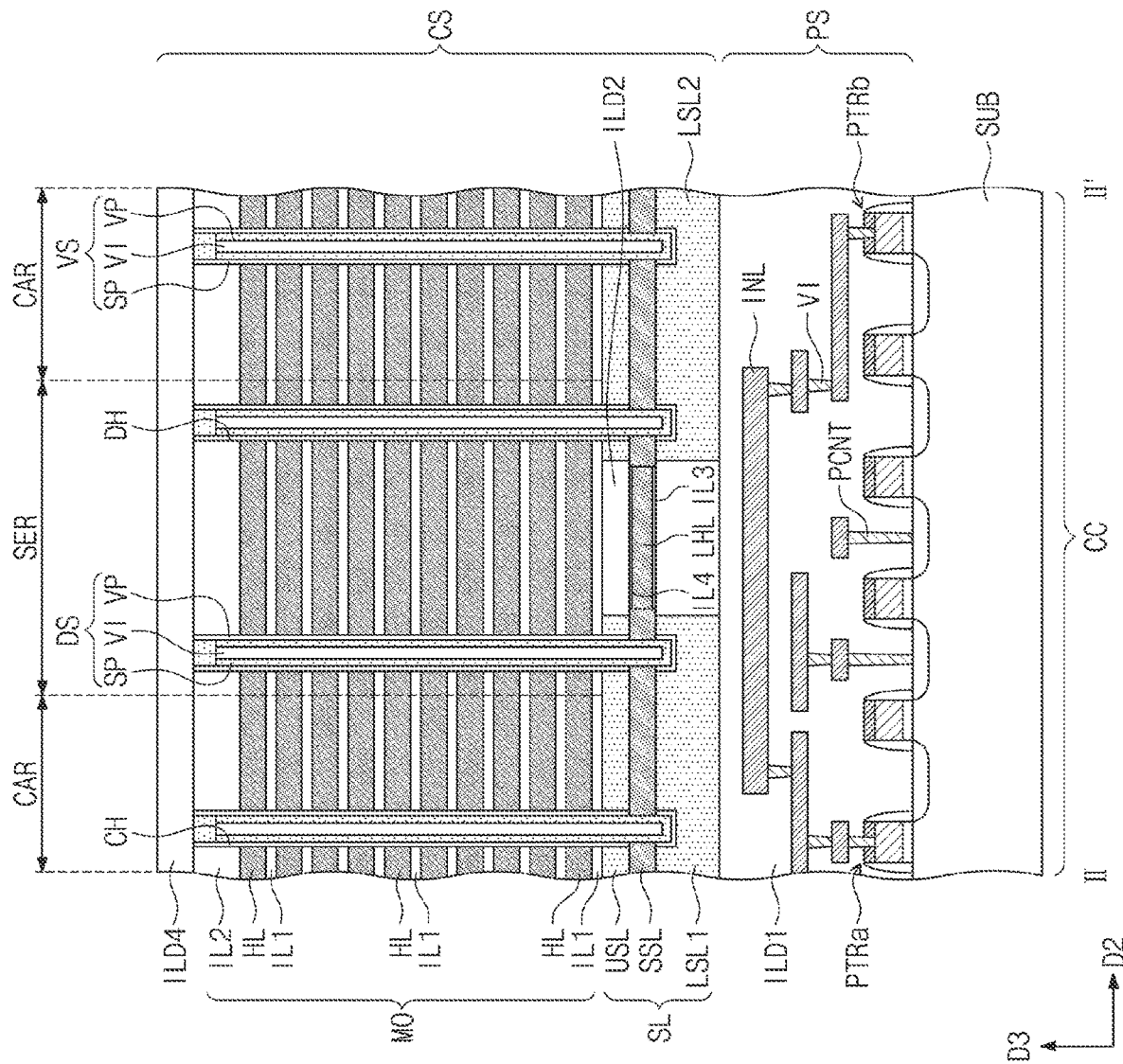
Figure 8C:
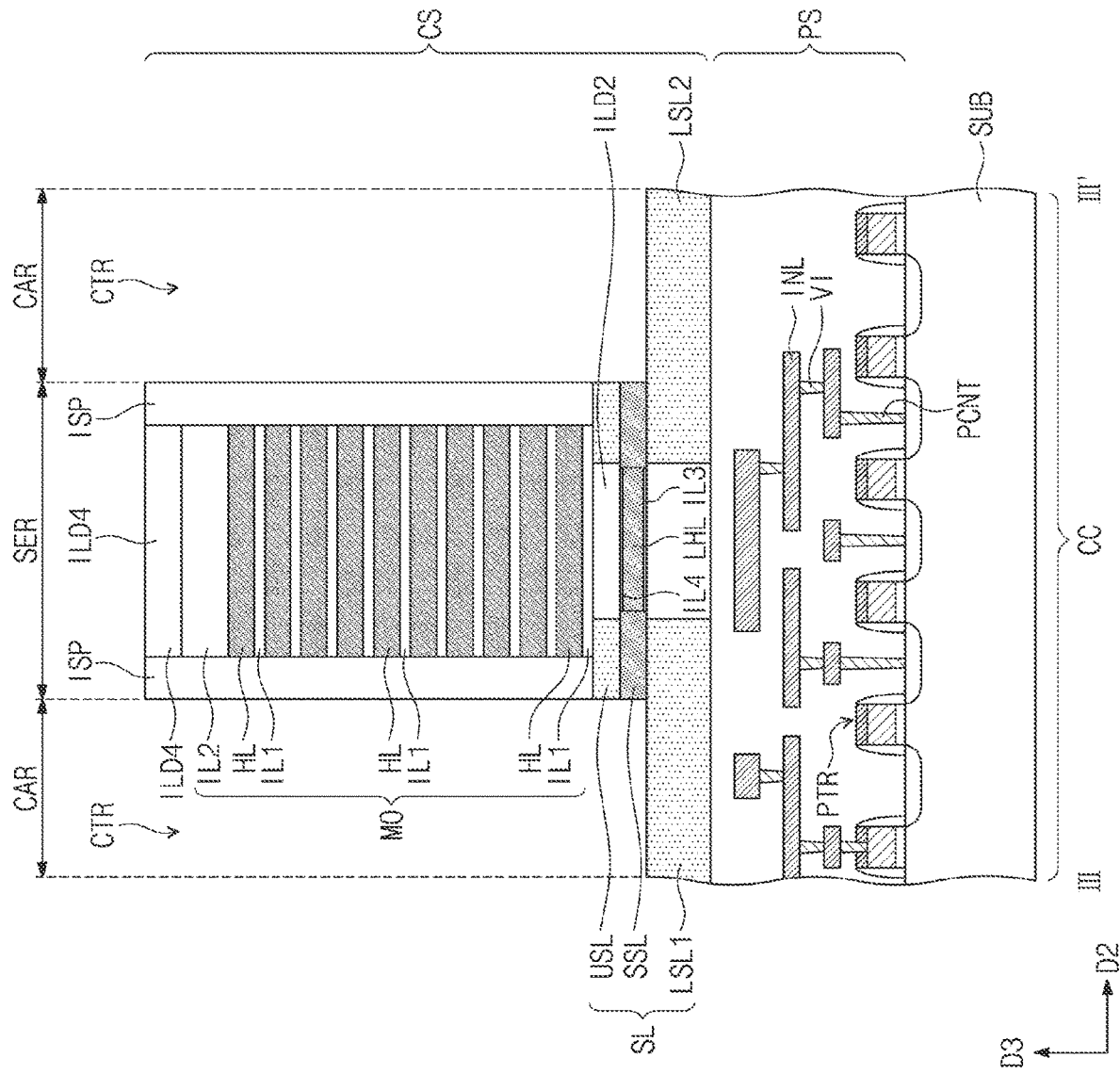
Figure 8D:
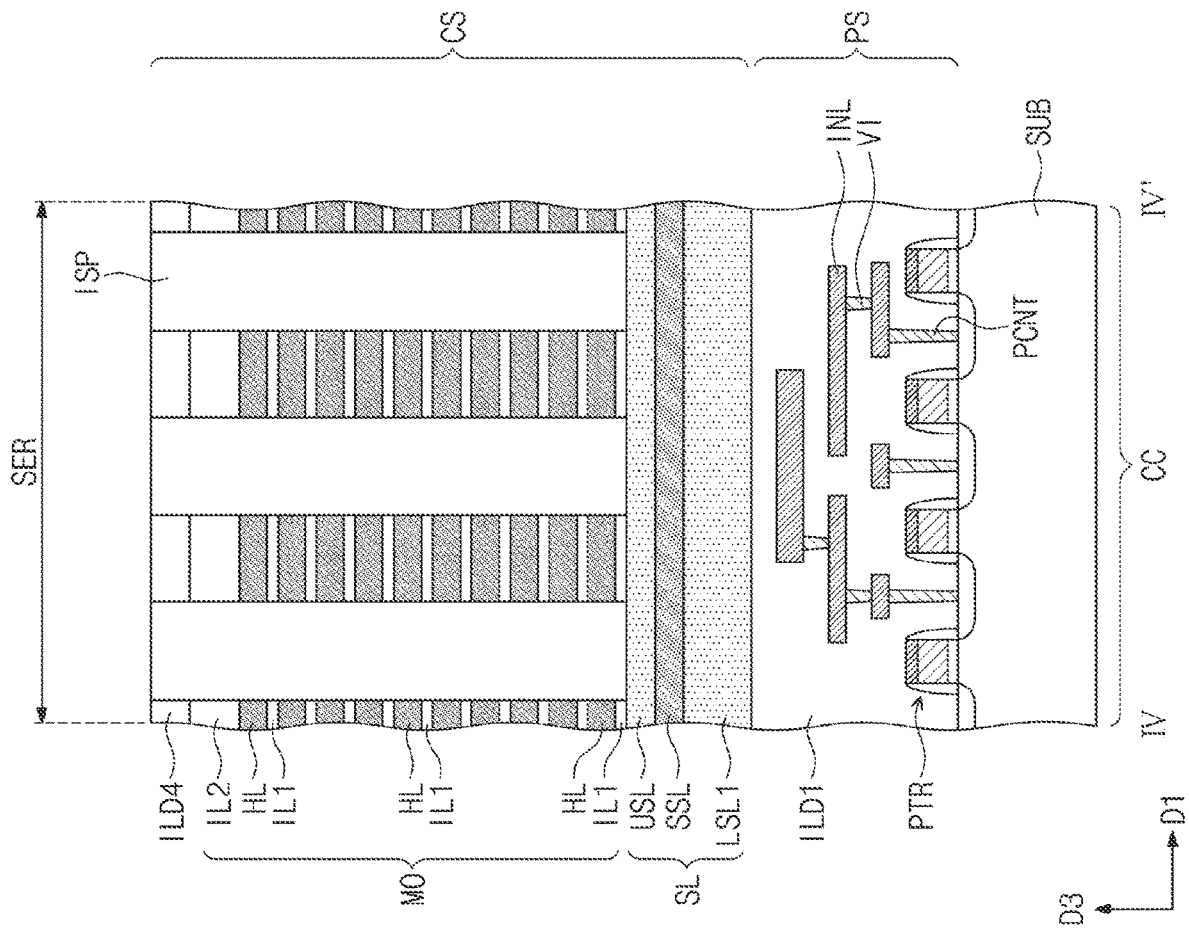
Figure 8E:
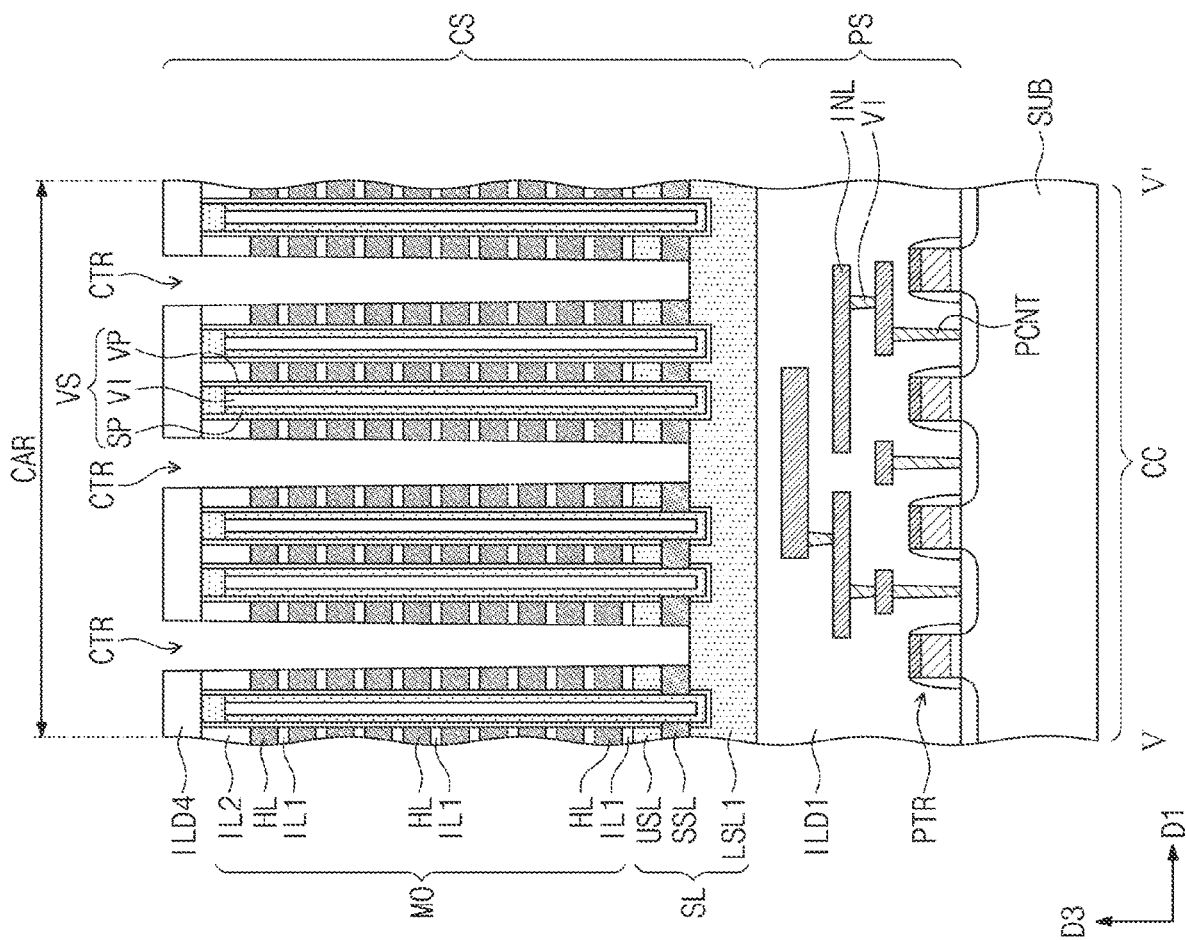

FIGS. 4A, 4B, 5A, 5B, 6A, 6B, 7A, 7B, 7C, 7D, 8A, 8B, 8C, 8D and 8E collectively illustrate method(s) of manufacturing a 3D semiconductor memory device according to embodiments of the inventive concept. Here, FIGS. 4A, 5A, 6A, 7A and 8A are cross-sectional views taken along the line I-I' of FIG. 2; FIGS. 4B, 5B, 6B, 7B and 8B are cross-sectional views taken along the line II-II' of FIG. 2; FIGS. 7C and 8C are cross-sectional views taken along the line III-III' of FIG. 2; FIGS. 7D and 8D are cross-sectional views taken along the line IV-IV' of FIG. 2; and FIG. 8E is a cross-sectional view taken along the line V-V' of FIG. 2.

Figure 4A:
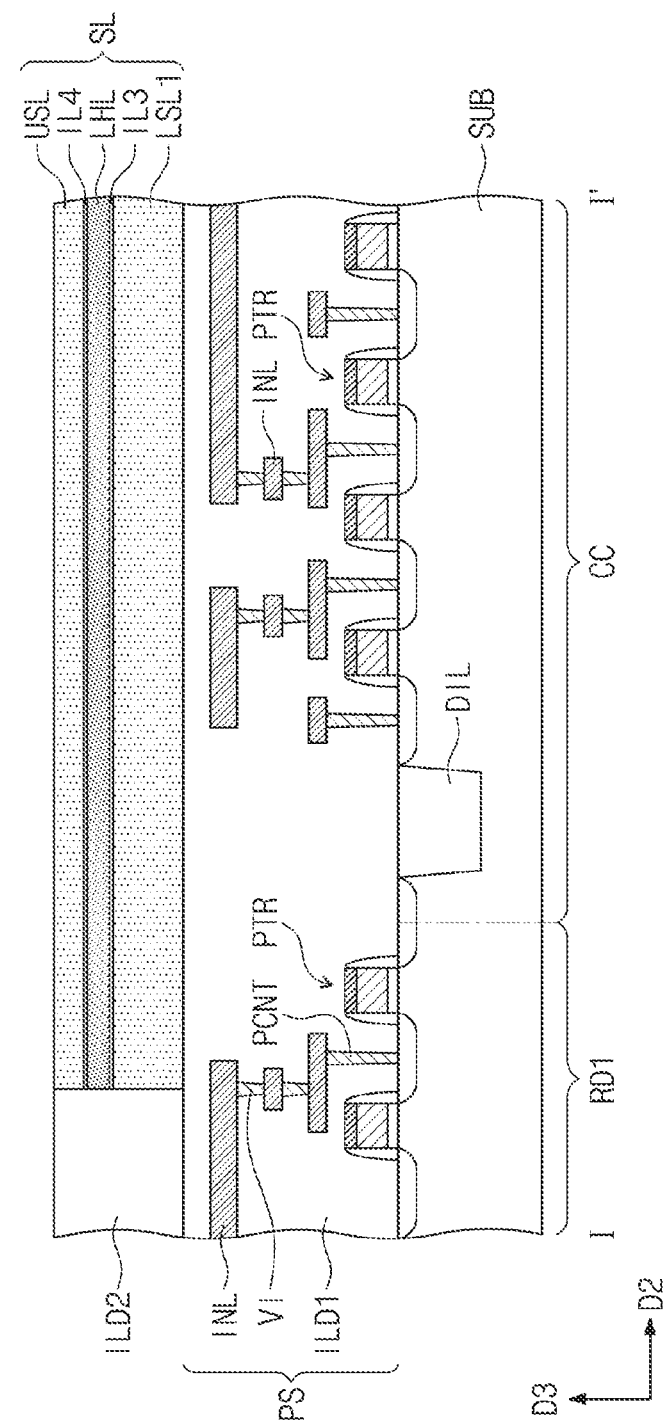
Figure 4B:
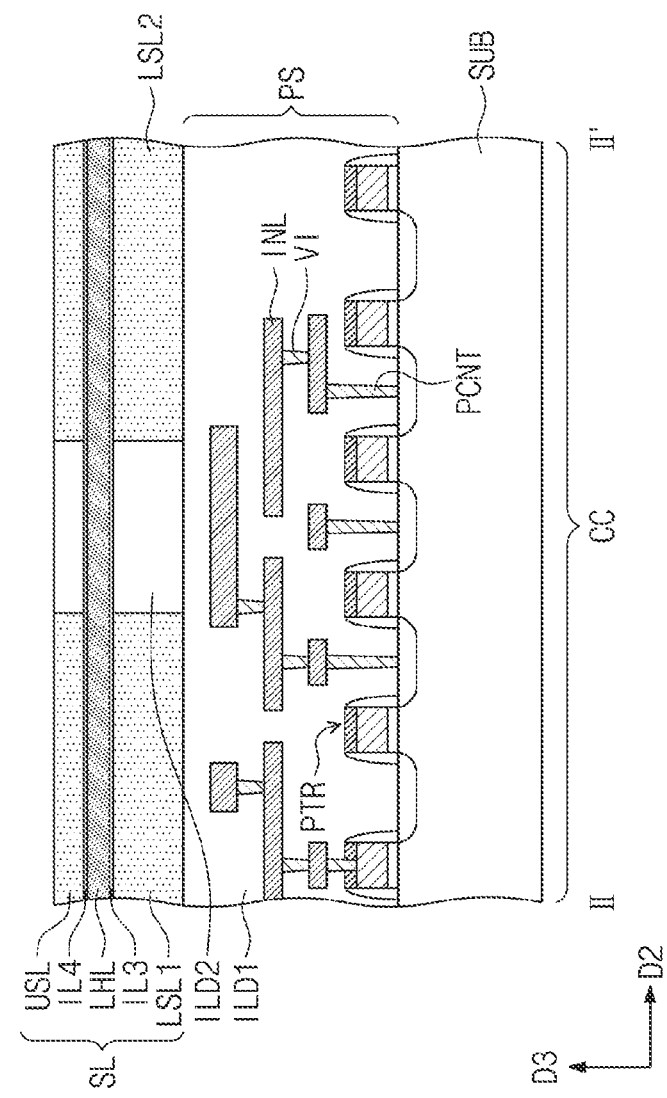
FIGS. 4B, 5B, 6B, 7B and 8B are cross-sectional views taken along the line II-II' of FIG. 2.

Referring to FIGS. 2, 4A and 4B, a peripheral circuit structure PS may be formed on a first substrate SUB. The formation of the peripheral circuit structure PS may include forming peripheral transistors PTR on the first substrate SUB, and forming lower interconnection lines INL on the peripheral transistors PTR.

For example, the formation of the peripheral transistors PTR may include forming a device isolation layer DIL in the first substrate SUB to define active regions, forming a gate insulating layer and gate electrodes on the active regions, and injecting dopants into the active regions to form source/drain regions.

A first interlayer insulating layer ILD1 covering the peripheral transistors PTR and the lower interconnection lines INL may be formed. First and second lower semiconductor layers LSL1 and LSL2 may be formed on the first interlayer insulating layer ILD1. The formation of the first and second lower semiconductor layers LSL1 and LSL2 may include forming a lower semiconductor layer on the first interlayer insulating layer ILD1, and patterning the lower semiconductor layer in quadrilateral plate shapes.

The first and second lower semiconductor layers LSL1 and LSL2 may include a semiconductor material such as poly-silicon. The first and second lower semiconductor layers LSL1 and LSL2 may be spaced apart in the second direction D2. An insulating layer may be formed to fill a space between the first and second lower semiconductor layers LSL1 and LSL2.

A third insulating layer IL3, a lower sacrificial layer LHL and a fourth insulating layer IL4 may be sequentially formed on the first and second lower semiconductor layers LSL1 and LSL2. For example, each of the third and fourth insulating layers IL3 and IL4 may include a silicon oxide layer, and the lower sacrificial layer LHL may include a silicon nitride layer or a silicon oxynitride layer.

An upper semiconductor layer USL may be formed on the fourth insulating layer IL4. The upper semiconductor layer USL may be patterned to be divided into segments overlapping with the first and second lower semiconductor layers LSL1 and LSL2, respectively. These segments may be referred to as upper semiconductor layers USL. An insulating layer may be formed to fill a space between the upper semiconductor layers USL.

The first and second lower semiconductor layers LSL1 and LSL2, the lower sacrificial layer LHL and the upper semiconductor layers USL may constitute a second substrate SL. The insulating layers formed at the same level as the second substrate SL may constitute a second interlayer insulating layer ILD2.

Figure 5A:
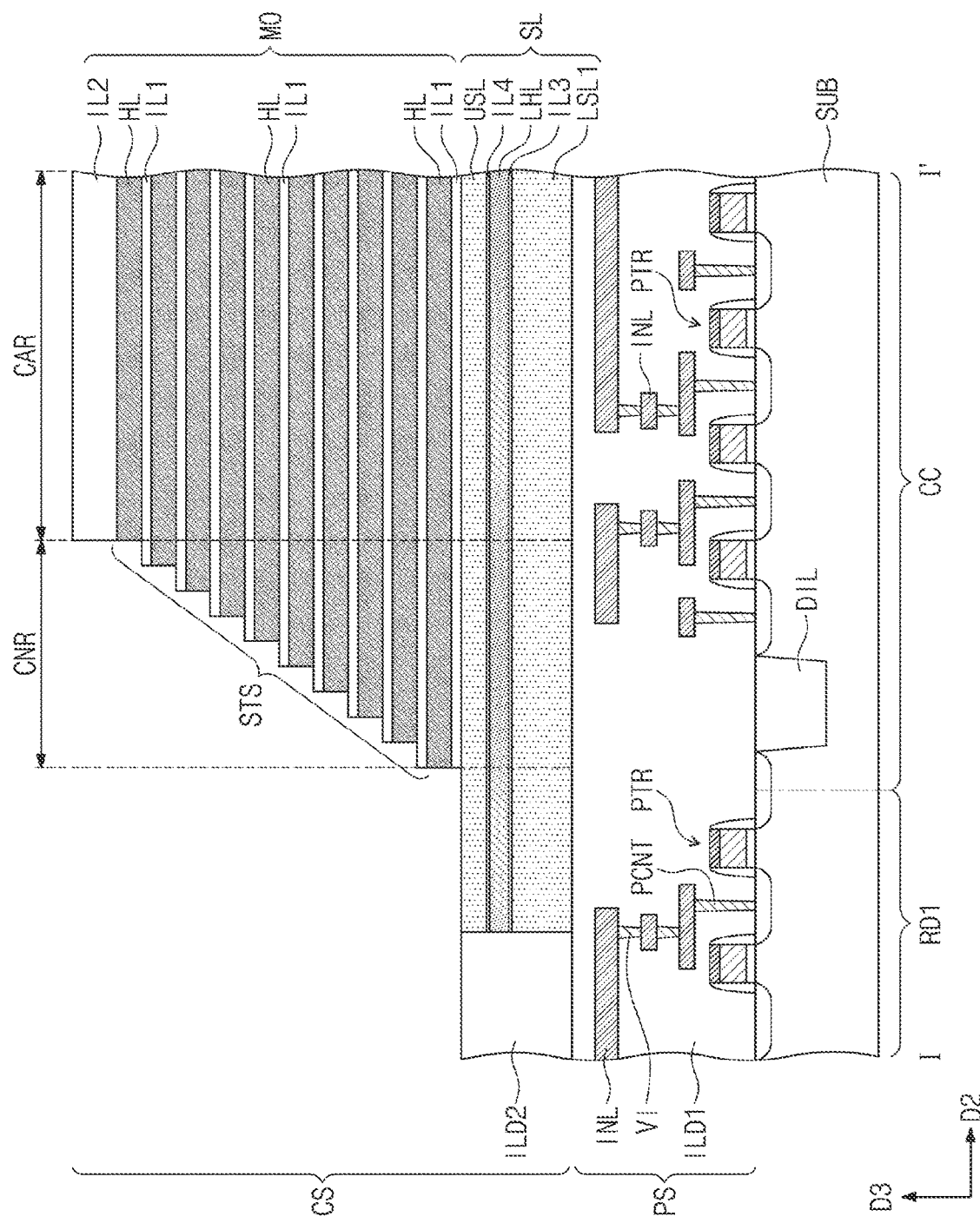
Figure 5B:
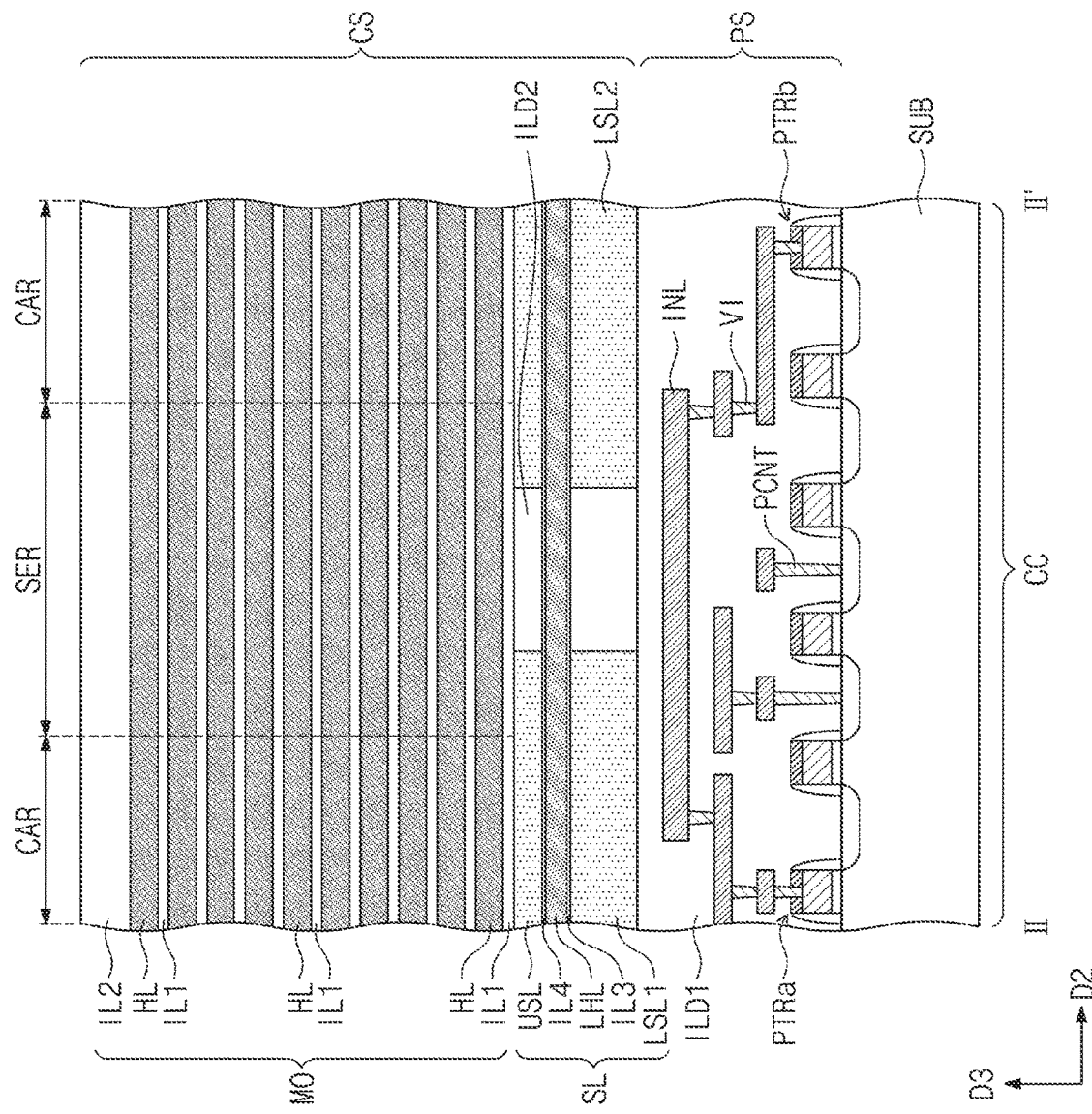

Referring to FIGS. 2, 5A and 5B, a mold structure MO may be formed on the second substrate SL. For example, first insulating layers IL1 and sacrificial layers HL may be alternately stacked on the second substrate SL to form the mold structure MO. A second insulating layer IL2 may be formed at the uppermost layer of the mold structure MO.

The first insulating layers IL1, the sacrificial layers HL and the second insulating layer IL2 may be deposited using a thermal chemical vapor deposition (thermal CVD) process, a plasma-enhanced CVD process, a physical CVD process, and/or an atomic layer deposition (ALD) process. For example, each of the first insulating layers IL1 may include a silicon oxide layer, and each of the sacrificial layers HL may include a silicon nitride layer or a silicon oxynitride layer.

A stair-stepped structure STS may be formed at the mold structure MO of the connection region CNR. For example, a cycle process may be performed on the mold structure MO to form the stair-stepped structure STS in the connection region CNR. The formation of the stair-stepped structure STS may include forming a mask pattern (not shown) on the mold structure MO, and repeatedly performing a cycle using the mask pattern a plurality of times. The cycle may include a process of etching a portion of the mold structure MO by using the mask pattern as an etch mask, and a trimming process of shrinking the mask pattern.

Figure 6B:
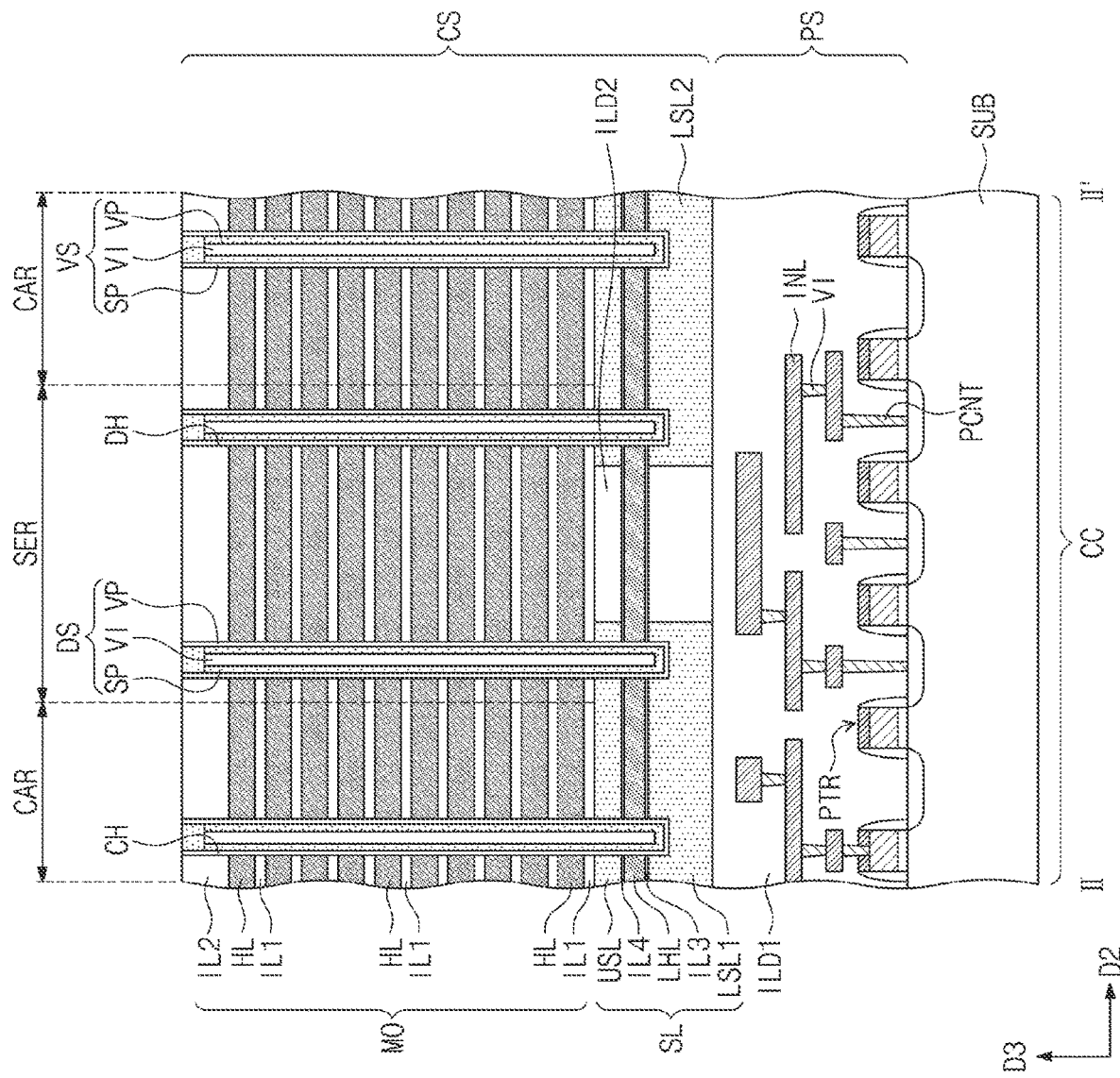

Referring to FIGS. 2, 6A and 6B, a third interlayer insulating layer ILD3 may be formed on the mold structure MO. The formation of the third interlayer insulating layer ILD3 may include forming a thick insulating layer covering the mold structure MO, and performing a planarization process on the thick insulating layer until the second insulating layer IL2 is exposed. Thus, the third interlayer insulating layer ILD3 may cover the stair-stepped structure STS.

Channel holes CH may be formed to penetrate the mold structure MO of the cell array region CAR. The channel holes CH may expose the first and second lower semiconductor layers LSL1 and LSL2. A bottom surface of each of the channel holes CH may be located at a level between a bottom surface and a top surface of the lower semiconductor layer LSL1 or LSL2. For example, the formation of the channel holes CH may include forming a mask pattern (not shown) having openings defining the channel holes CH on the mold structure MO, and anisotropically etching the mold structure MO using the mask pattern as an etch mask.

The channel holes CH may be arranged in a line or zigzag form in one direction when viewed in plan. The anisotropic etching process for forming the channel holes CH may be a plasma etching process, a reactive ion etching (RIE) process, an inductively coupled plasma reactive ion etching (ICP-RIE) process, or an ion beam etching (IBE) process.

Dummy holes DH may be formed to penetrate the mold structure MO of the separation region SER. The dummy holes DH may be formed simultaneously with the channel holes CH. That is, the channel holes CH and the dummy holes DH may be formed at the same time by the anisotropic etching process described above. The channel holes CH and the dummy holes DH may exhaust gas remaining in the mold structure MO.

Vertical channel structures VS may be formed in the channel holes CH, respectively. The formation of the vertical channel structure VS may include sequentially forming a vertical insulating layer, a vertical semiconductor layer and a filling insulation layer on an inner surface of the channel hole CH, and performing a planarization process until a top surface of the second insulating layer IL2 is exposed. The vertical insulating layer and the vertical semiconductor layer may be conformally formed.

That is, a vertical insulating pattern VP covering the inner surface of the channel hole CH may be formed. The vertical insulating pattern VP may have a pipe shape having an opened top end. The vertical insulating pattern VP may include a data storage layer. A vertical semiconductor pattern SP covering an inner surface of the vertical insulating pattern VP may be formed. The vertical semiconductor pattern SP may have a pipe shape having an opened top end. A filling insulation pattern VI filling the inside of the pipe shape of the vertical semiconductor pattern SP may be formed. The vertical insulating pattern VP, the vertical semiconductor pattern SP and the filling insulation pattern VI may constitute the vertical channel structure VS. A conductive pad (PAD) may be formed on each of the vertical channel structures VS.

Dummy structures DS may be formed in the dummy holes DH, respectively. The dummy structures DS may be formed simultaneously with the vertical channel structures VS. Thus, each of the dummy structures DS may include the same material(s) as the vertical channel structure VS (e.g., the vertical insulating pattern VP), the vertical semiconductor pattern SP and the filling insulation pattern VI.

Figure 9A:
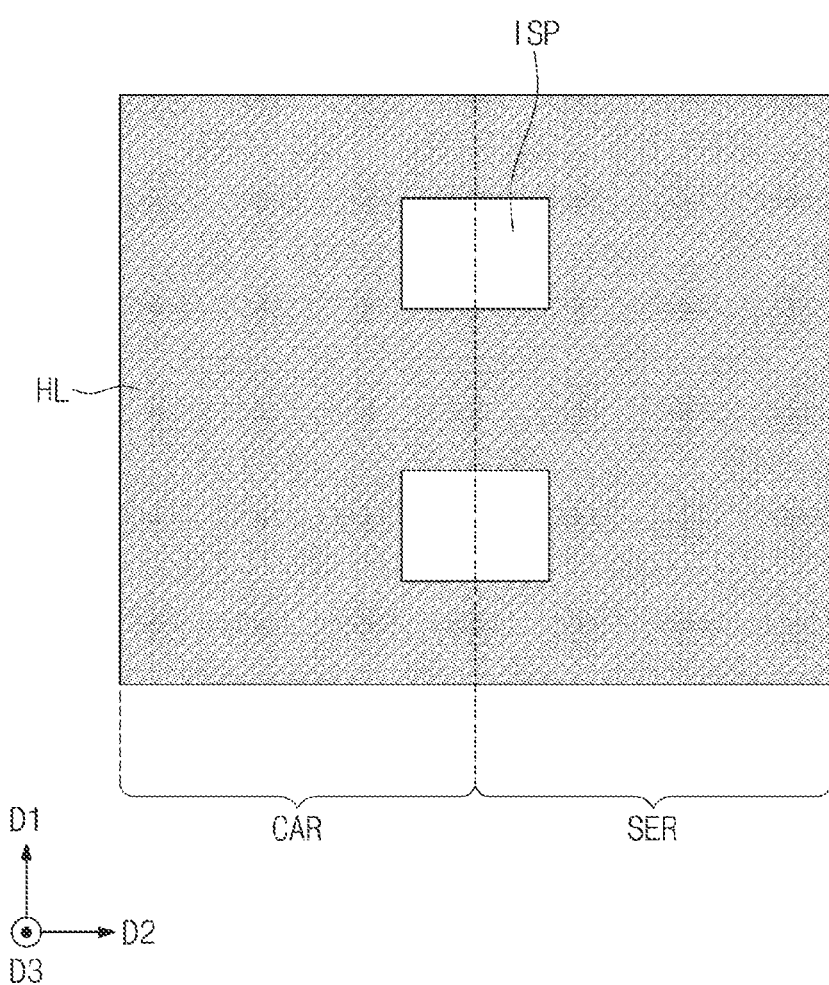
FIGS. 9A, 9B and 9C are plan views illustrating a method of manufacturing a 3D semiconductor memory device according to embodiments of the inventive concept.
Figure 9B:
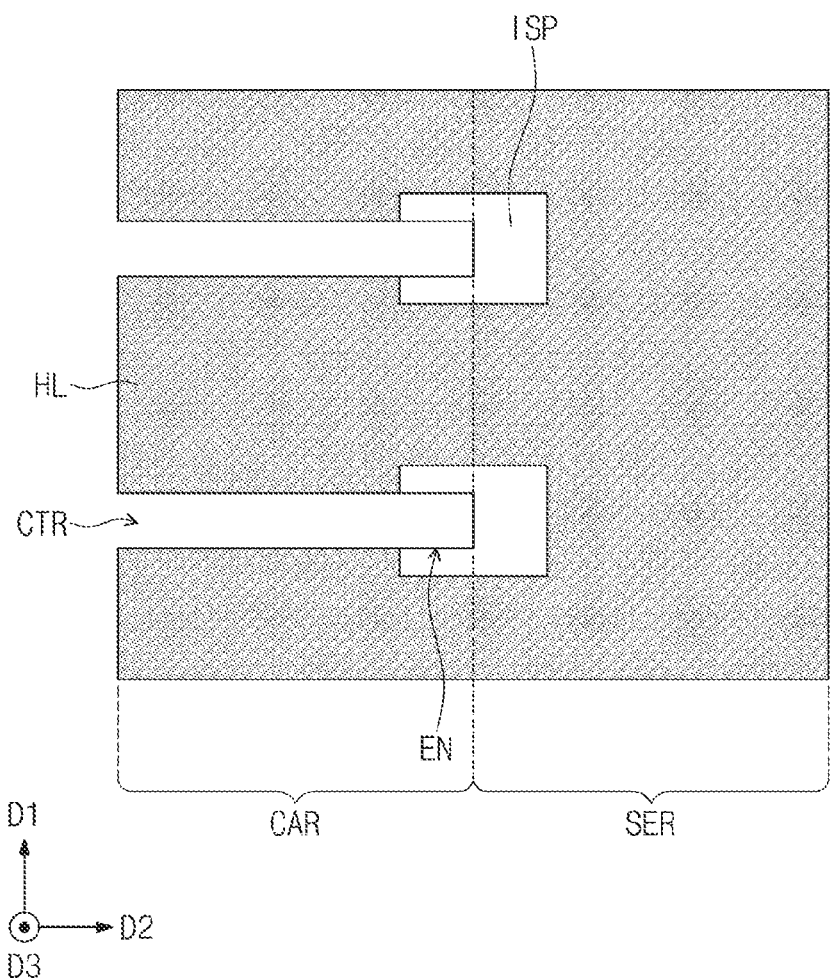
Figure 9C:
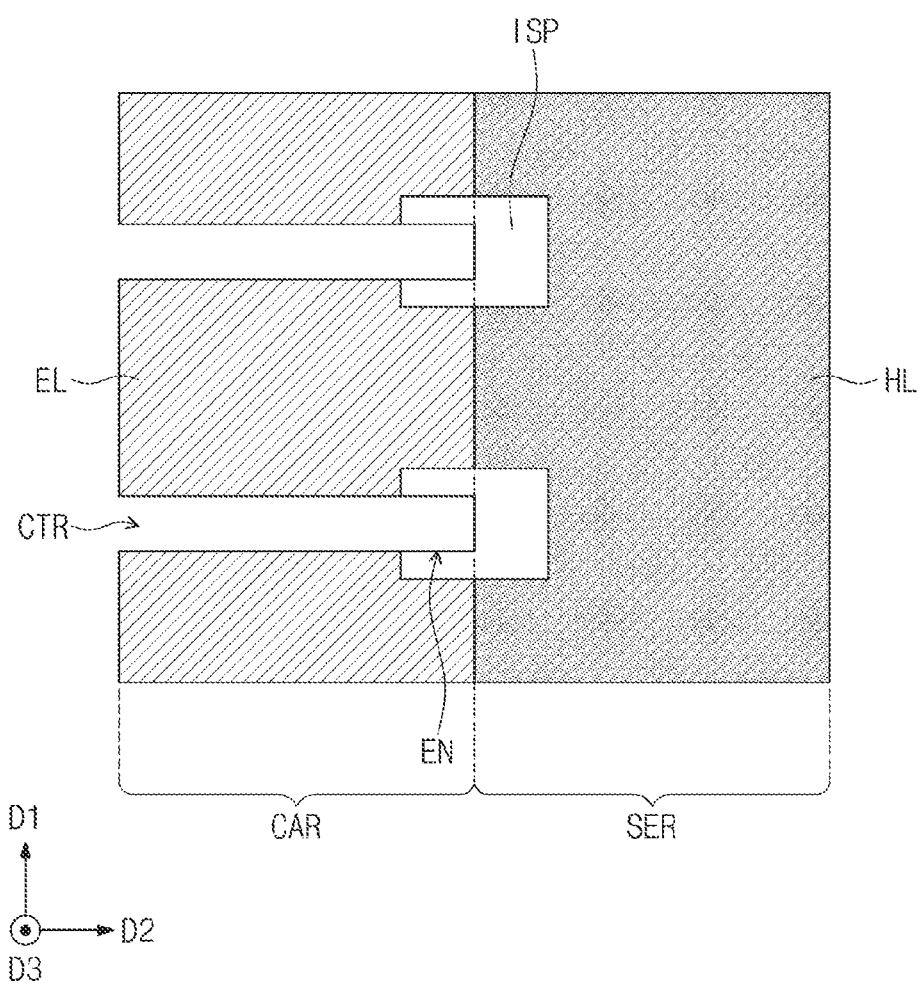

FIGS. 9A, 9B and 9C are respective plan views illustrating a method of manufacturing a 3D semiconductor memory device according to embodiments of the inventive concept. With reference to FIGS. 9A, 9B and 9C, a method of replacing the sacrificial layers HL of the cell array region CAR with electrodes EL while leaving the sacrificial layers HL of the mold structure MO of the separation region SER will be described.

Referring to FIGS. 2, 7A, 7B, 7C, 7D and 9A, a fourth interlayer insulating layer ILD4 may be formed on the mold structure MO and the third interlayer insulating layer ILD3. Separation insulating patterns ISP may be formed at a boundary between the cell array region CAR and the separation region SER by using a process of patterning the mold structure MO. The separation insulating patterns ISP may be arranged in the first direction D1 along the boundary. (See, e.g., FIG. 9A).

That is, the formation of the separation insulating patterns ISP may include forming through-holes penetrating the mold structure MO, and filling the through-holes with an insulating material. The through-holes may be formed by anisotropically etching the mold structure MO until the upper semiconductor layers USL are exposed.

Referring to FIGS. 2, 8A, 8B, 8C, 8D, 8E and 9B, the mold structure MO may be patterned to form a plurality of cutting trenches CTR penetrating the mold structure MO. The cutting trenches CTR may extend in the second direction D2 in parallel to each other in the connection region CNR and the cell array region CAR. The cutting trenches CTR may not be formed in the separation region SER.

The cutting trenches CTR may expose the first and second lower semiconductor layers LSL1 and LSL2. The cutting trench CTR may expose the sacrificial layers HL of the mold structure MO. (See, e.g., FIG. 8E). The cutting trench CTR may expose a sidewall of the lower sacrificial layer LHL.

Referring to FIG. 9B, an end EN of each of the cutting trenches CTR may be formed in the separation insulating pattern ISP. A portion of the separation insulating pattern ISP may be etched by an etching process for forming the cutting trench CTR. However, since a width of the separation insulating pattern ISP is greater than a width of the cutting trench CTR, the separation insulating pattern ISP may surround the end EN of the cutting trench CTR when viewed in plan. As a result, the end EN of the cutting trench CTR may be surrounded by the separation insulating pattern ISP and thus may not expose the sacrificial layers HL of the mold structure MO.

Referring to FIGS. 2, 8A, 8B, 8C, 8D and 8E, the lower sacrificial layer LHL exposed by the cutting trenches CTR may be replaced with a source semiconductor layer SSL. That is, the lower sacrificial layer LHL exposed by the cutting trenches CTR may be selectively removed. A lower portion of the vertical insulating pattern VP of each of the vertical channel structures VS may be exposed by the removal of the lower sacrificial layer LHL.

The removal of the lower sacrificial layer LHL may be isotropically performed using a wet etching process. Thus, the lower sacrificial layer LHL adjacent to the cutting trench CTR may be removed, but the lower sacrificial layer LHL spaced apart from the cutting trench CTR may not be removed but may remain. For example, as illustrated in FIGS. 8B and 8C, the lower sacrificial layer LHL located in a central region of the separation region SER may not be removed but may remain.

The lower portion of the vertical insulating pattern VP exposed by the removal of the lower sacrificial layer LHL may be selectively removed. Thus, a lower portion of the vertical semiconductor pattern SP may be exposed. The third insulating layer IL3 and the fourth insulating layer IL4 may be removed together during the removal of the lower portion of the vertical insulating pattern VP.

The source semiconductor layer SSL may be formed in a space formed by the removal of the lower sacrificial layer LHL. The source semiconductor layer SSL may be in direct contact with the exposed lower portion of the vertical semiconductor pattern SP. The source semiconductor layer SSL may be in direct contact with the lower semiconductor layer LSL1 or LSL2 thereunder. The source semiconductor layer SSL may be in direct contact with the upper semiconductor layer USL thereon.

The formation of the source semiconductor layer SSL may use a process of selectively depositing a semiconductor material (e.g., poly-silicon) in only the space formed by the removal of the lower sacrificial layer LHL through the cutting trench CTR. Thus, the cutting trench CTR may not be filled with the semiconductor material but may remain as an empty space.

Referring to FIGS. 2, 3A, 3B, 3C, 3D, 3E and 9C, the sacrificial layers HL exposed by the cutting trenches CTR may be replaced with electrodes EL, respectively, and thus first and second electrode structures ST1 and ST2 may be formed. In detail, the sacrificial layers HL exposed through the cutting trenches CTR may be selectively removed. The electrodes EL may be formed in spaces respectively resulting from the removal of the sacrificial layers HL.

As described above, the separation insulating patterns ISP may prevent the sacrificial layers HL of the separation region SER from being exposed by the cutting trenches CTR. Thus, the sacrificial layers HL of the separation region SER may not be replaced with the electrodes EL but may remain. That is, the mold structure MO of the separation region SER may remain.

During the formation of the electrodes EL, a stack structure may become structurally unstable by removal of the sacrificial layers HL of the cell array region CAR. This result may occur because cavities are formed in the stack structure. In some embodiments, however, the sacrificial layers HL of the mold structure MO of the separation region SER may not be removed, but may remain. Accordingly, the mold structure MO of the separation region SER may function as a support of the stack structure. Thus, it is possible to prevent the first and second electrode structures ST1 and ST2 from collapsing or leaning during the formation of the first and second electrode structures ST1 and ST2.

Separation structures SPS may be formed by filling the cutting trenches CTR with an insulating material. The separation structures SPS may node-separate the electrodes EL arranged at the same level.

At least one through-contact TVS may be formed on the first and second row decoder regions RD1 and RD2. At least one through-contact TVS may be formed in the separation region SER. The through-contacts TVS may extend from the fourth interlayer insulating layer ILD4 to the peripheral circuit structure PS.

Bit line contact plugs BPLG may be formed to penetrate the fourth interlayer insulating layer ILD4. The bit line contact plugs BPLG may be connected to the conductive pads PAD, respectively. Cell contact plugs PLG may be formed to penetrate the third and fourth interlayer insulating layers ILD3 and ILD4. The cell contact plugs PLG may be connected to the electrodes EL, respectively. Bit lines BL and upper interconnection lines UIL may be formed on the fourth interlayer insulating layer ILD4. The bit lines BL may be electrically connected to the bit line contact plugs BPLG, and the upper interconnection lines UIL may be electrically connected to the cell contact plugs PLG.

Figure 10:
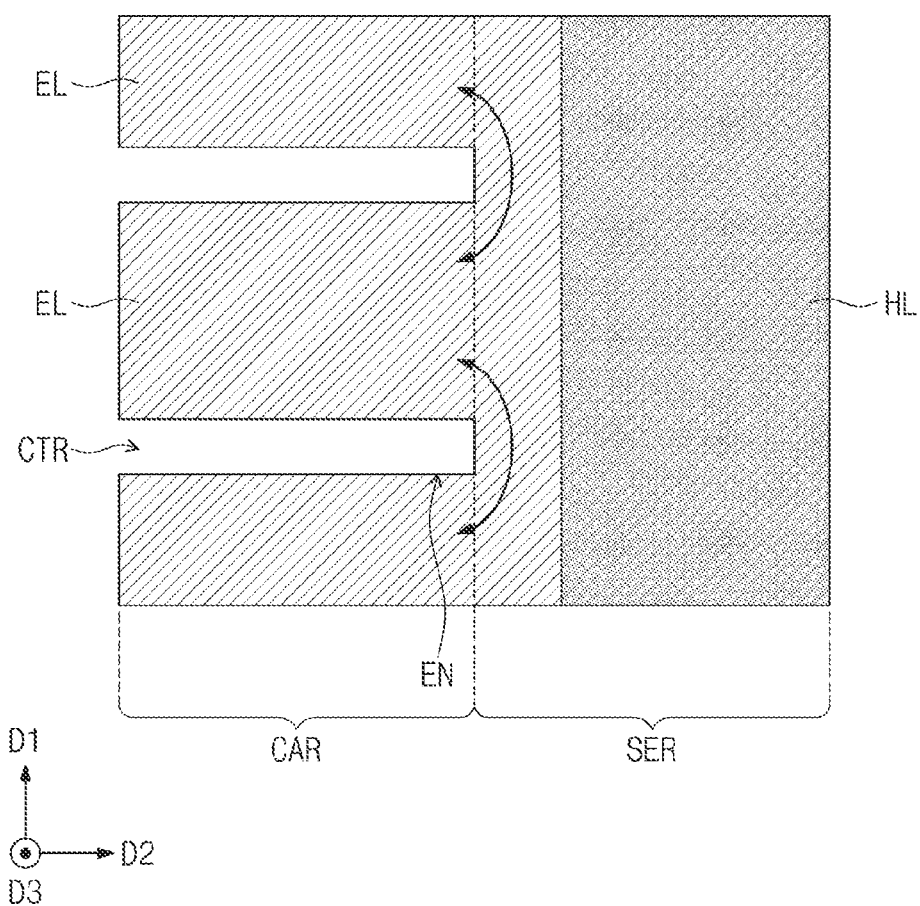
FIG. 10 is a plan view further illustrating a method of manufacturing a semiconductor memory device by way of a comparative example.

FIG. 10 is a plan view further illustrating a method of manufacturing a semiconductor memory device by way of a comparative example. Here, a process defect—which may occur when the separation insulating patterns ISP included in certain embodiments of the inventive concept are omitted—will now be described with reference to FIG. 10.

The sacrificial layer HL adjacent to the cutting trenches CTR may be removed through the cutting trenches CTR by an isotropic etching process. Since the separation insulating pattern ISP does not exist, the end EN of the cutting trench CTR may also expose the sacrificial layer HL. Thus, a portion of the sacrificial layer HL of the separation region SER may be removed by the isotropic etching process.

The electrodes EL may be formed in a region formed by the removal of the sacrificial layer HL. Meanwhile, an electrode EL may also be formed in the separation region SER. Thus, the electrode EL of the separation region SER may connect the electrodes EL of the cell array region CAR. Therefore, the electrodes EL may not be node-separated, but instead may be connected one with another.

Figure 11:
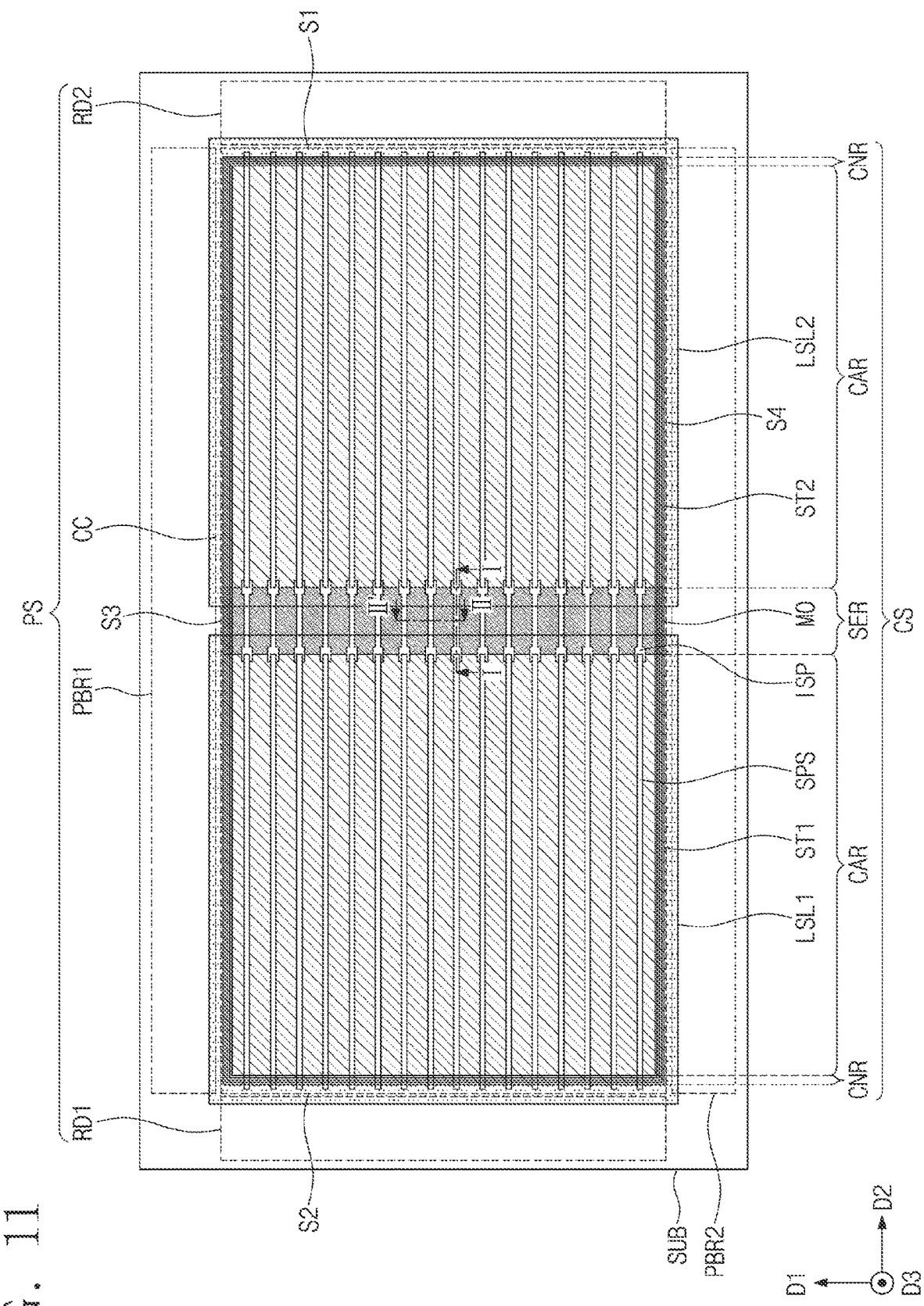
FIG. 11 is a plan view illustrating a 3D semiconductor memory device according to embodiments of the inventive concept.
Figure 12A:
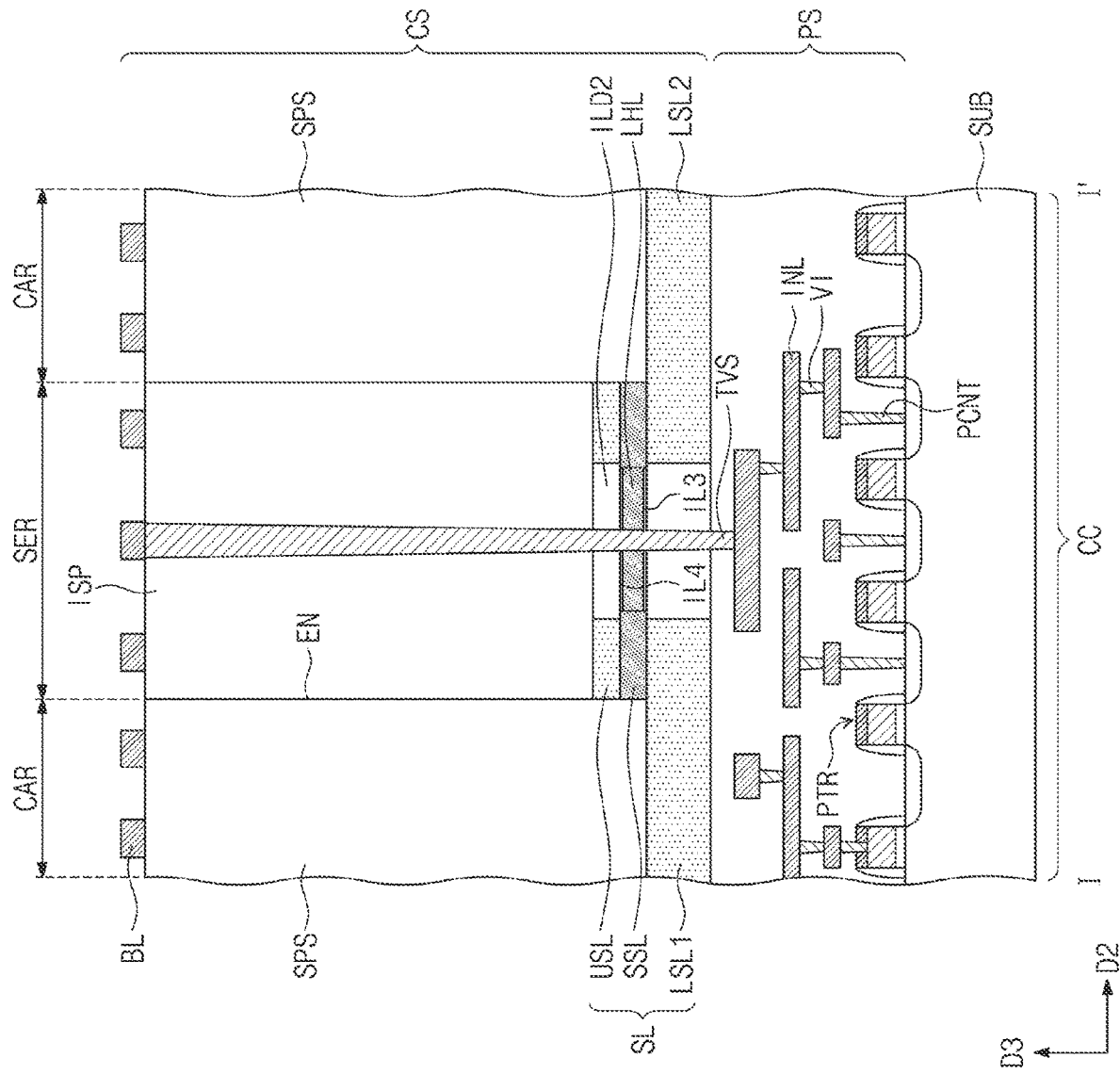
FIGS. 12A and 12B are cross-sectional views taken respectively along lines I-I' and II-II' of FIG. 11.
Figure 12B:
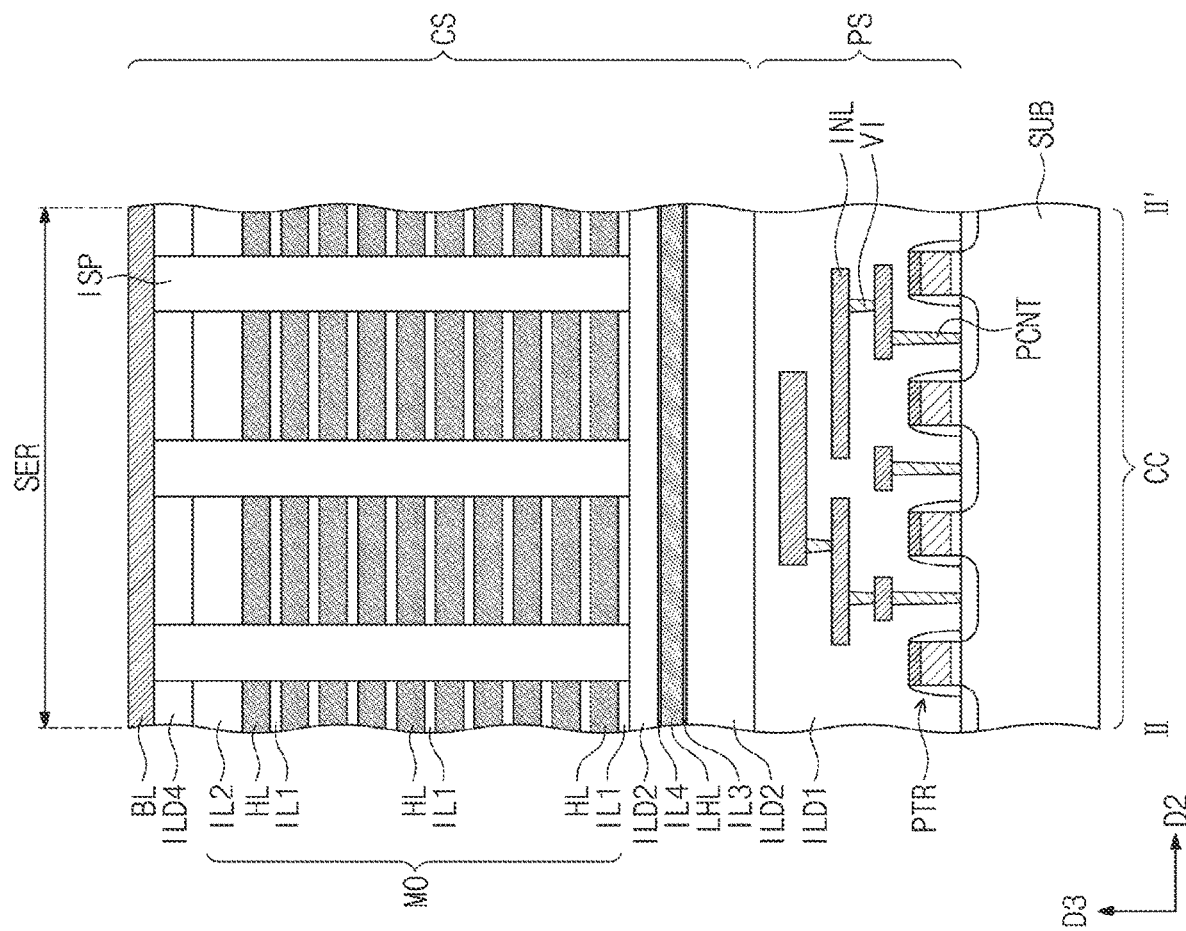

FIG. 11 is a plan view illustrating a 3D semiconductor memory device according to embodiments of the inventive concept. FIGS. 12A and 12B are cross-sectional views respectively taken along lines I-I' and II-II' of FIG. 11. The previous (and commonly applicable) description of the embodiments illustrated in FIGS. 2, 3A, 3B, 3C, 3D and 3E will be omitted here for brevity. Accordingly, only material differences between the embodiments of FIGS. 11A, 11B and 11C and the embodiments of FIGS. 2, 3A, 3B, 3C, 3D and 3E will be described.

Referring to FIGS. 11, 12A and 12B, separation insulating patterns ISP may intersect the separation region SER in the second direction D2. The separation insulating pattern ISP may have a line shape extending in the second direction D2. The separation insulating pattern ISP may have a dumbbell shape having a greater width at the boundary between the cell array region CAR and the separation region SER.

As illustrated in FIG. 12B, the separation insulating patterns ISP may penetrate the mold structure MO. At least one through-contact TVS may penetrate the separation insulating pattern ISP so as to be connected to the peripheral circuit structure PS.

Figure 13:
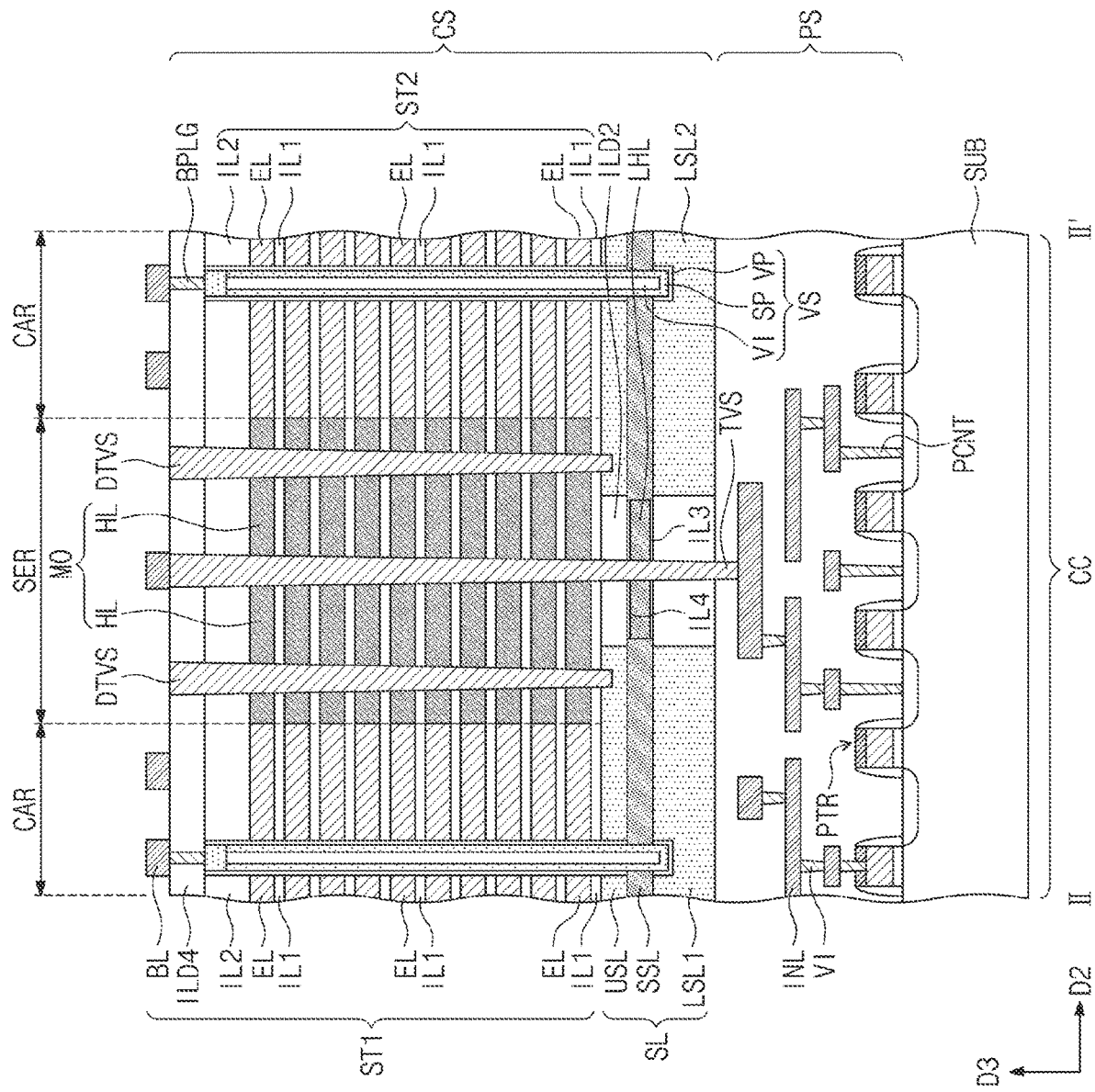
FIGS. 13 and 14 are cross-sectional views taken along the line II-II' of FIG. 2 and illustrate a 3D semiconductor memory devices according to embodiments of the inventive concept.
Figure 14:
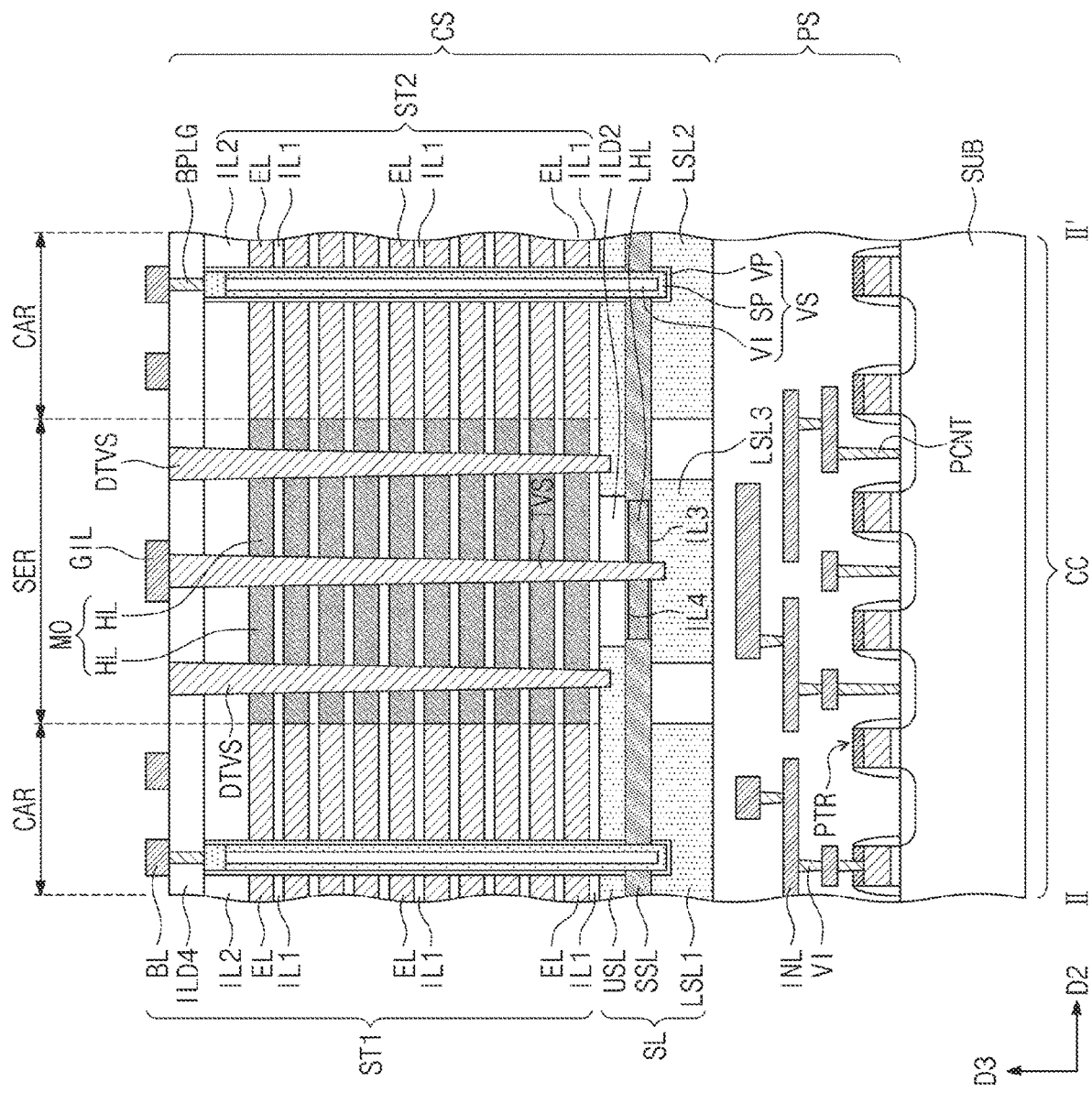

FIGS. 13 and 14 are cross-sectional views taken along the line II-II' of FIG. 2 and illustrate 3D semiconductor memory devices according to embodiments of the inventive concept. As before, only material differences between the embodiments of FIGS. 13 and 14 and the embodiments of FIGS. 2, 3A, 3B, 3C, 3D and 3E will be described.

Referring to FIG. 13, dummy contacts DTVS may be provided in the separation region SER. The dummy contacts DTVS may penetrate the mold structure MO so as to be connected to the upper semiconductor layer USL. However, the dummy contacts DTVS may not be electrically connected to the bit lines BL and the upper interconnection lines UIL and thus may be dummies not performing a circuit function. The formation of the dummy contacts DTVS may include a process of forming contact holes penetrating the mold structure MO. A process by-product (e.g., a gas) remaining in the mold structure MO may be exhausted to the outside through the contact holes.

Referring to FIG. 14, a third lower semiconductor layer LSL3 may be provided in the separation region SER. The third lower semiconductor layer LSL3 may be disposed between the first and second lower semiconductor layers LSL1 and LSL2. A through-contact TVS may be connected to the third lower semiconductor layer LSL3. The through-contact TVS may be electrically connected to a ground line GIL thereon. Thus, a ground voltage may be applied to the third lower semiconductor layer LSL3. Since the ground voltage is applied to the third lower semiconductor layer LSL3, a coupling phenomenon between the first and second lower semiconductor layers LSL1 and LSL2 may be prevented.

Figure 15:
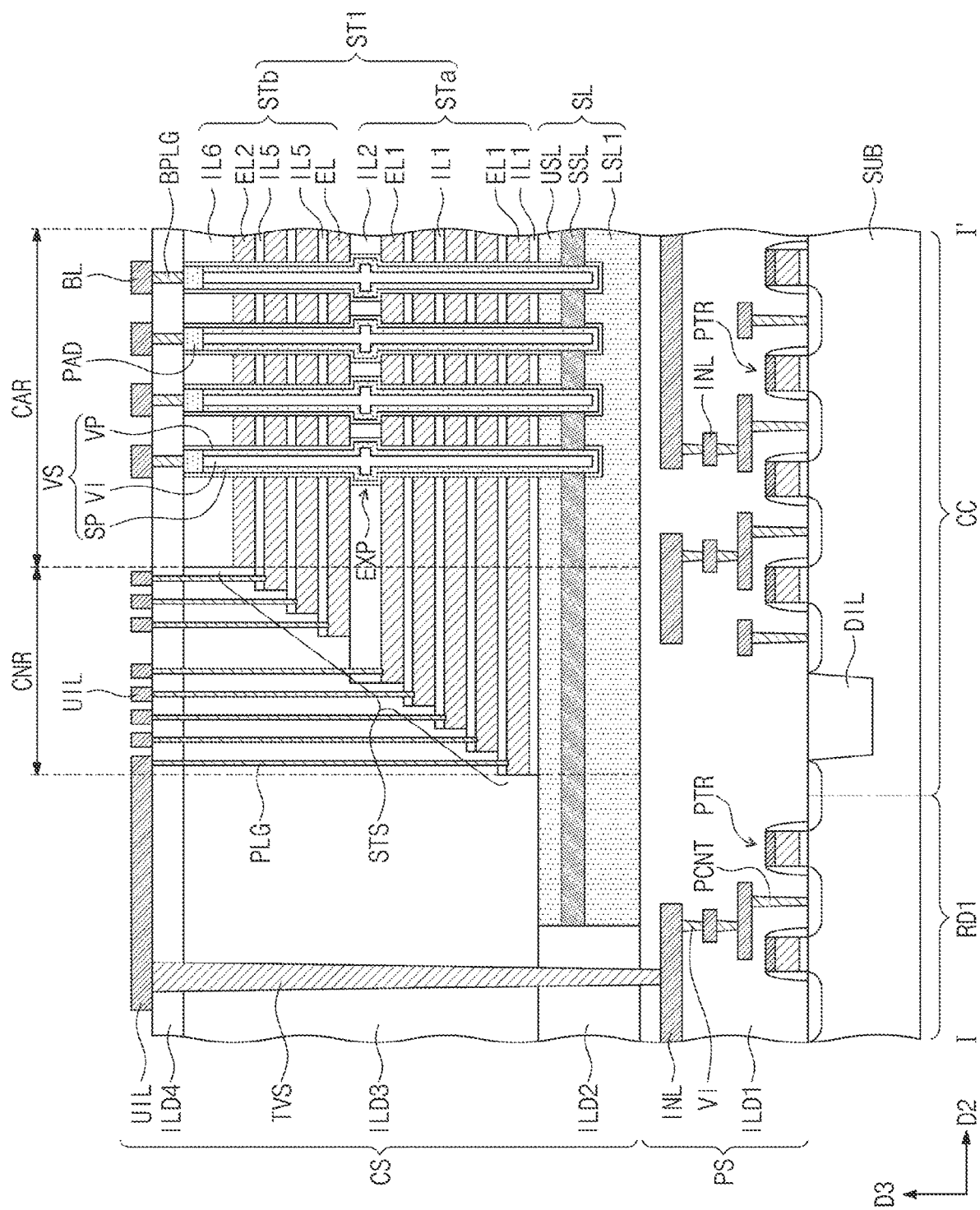
FIG. 15 is a cross-sectional view taken along the line I-I' of FIG. 2 and illustrates a 3D semiconductor memory device according to embodiments of the inventive concept.

FIG. 15 is a cross-sectional view taken along the line I-I' of FIG. 2 and illustrates a 3D semiconductor memory device according to embodiments of the inventive concept. Once again, only material differences between the embodiment of FIG. 15 and the embodiments of FIGS. 2, 3A, 3B, 3C, 3D and 3E will be described.

Referring to FIG. 15, each of first and second electrode structures ST1 and ST2 may include a lower structure STa and an upper structure STb on the lower structure STa.

The lower structure STa may include first electrodes EL1 stacked in the third direction D3 on the second substrate SL. The lower structure STa may further include first insulating layers IL1 separating the stacked first electrodes EL1 from each other. The first insulating layers IL1 and the first electrodes EL1 of the lower structure STa may be alternately stacked in the third direction D3. A second insulating layer IL2 may be provided in an uppermost portion of the lower structure STa. The second insulating layer IL2 may be thicker than each of the first insulating layers IL1.

The upper structure STb may include second electrodes EL2 stacked in the third direction D3 on the lower structure STa. The upper structure STb may further include fifth insulating layers IL5 separating the stacked second electrodes EL2 from each other. The fifth insulating layers 115 and the second electrodes EL2 of the upper structure STb may be alternately stacked in the third direction D3. A sixth insulating layer IL6 may be provided in an uppermost portion of the upper structure STb. The sixth insulating layer IL6 may be thicker than each of the fifth insulating layers IL5.

Each of vertical channel structures VS may include a first vertical extension penetrating the lower structure STa, a second vertical extension penetrating the upper structure STb, and an expansion portion EXP between the first and second vertical extensions. The expansion portion EXP may be provided in the second insulating layer IL2. A diameter of the vertical channel structure VS may increase sharply at the expansion portion EXP.

In 3D semiconductor memory devices according to embodiments of the inventive concept, a process defect in which electrode structures collapse or lean may be prevented by the use of a mold structure as described above. The electrode structures may operate as the memory blocks independent of each other, and thus one or more may be used as repair block(s). The cell array region may include the memory blocks separated from each other, but the peripheral circuit region thereunder may be realized as a single global connection region. Thus, the design efficiency of the peripheral circuit may be improved.

While the inventive concept have been described with reference to example embodiments, it will be apparent to those skilled in the art that various changes and modifications may be made without departing from the scope of the inventive concept. Here, the scope of the inventive concept should be offered the broadest permissible interpretation of the following claims and their equivalents.

What is claimed is:

1. A three-dimensional (3D) semiconductor memory device comprising:
    a substrate;
    a peripheral circuit structure on the substrate;
    an electrode structure including electrodes stacked on the peripheral circuit structure;
    a mold structure adjacent to the electrode structure, the mold structure including first insulating layers and second insulating layers that are alternately stacked on the peripheral circuit structure;
    a vertical channel structure penetrating the electrode structure;
    a dummy contact penetrating the mold structure; and
    a through-contact penetrating the mold structure to extend to the peripheral circuit structure,
    wherein the dummy contact fills a dummy hole penetrating the mold structure.

2. The 3D semiconductor memory device of claim 1, further comprising a bit line electrically connected to the vertical channel structure,
    wherein the dummy contact is not electrically connected to the bit line.

3. The 3D semiconductor memory device of claim 1, wherein the peripheral circuit structure includes peripheral transistors and lower interconnection lines on the peripheral transistors, and
    wherein the through-contact is electrically connected to an uppermost one of the lower interconnection lines.

4. The 3D semiconductor memory device of claim 1, wherein, when viewed in plan, the mold structure has a line shape that extends in a first direction.

5. The 3D semiconductor memory device of claim 1, wherein the second insulating layers are at the same level as the electrodes, respectively.

6. The 3D semiconductor memory device of claim 1, wherein a top surface of the dummy contact is higher than a top surface of the vertical channel structure.

7. The 3D semiconductor memory device of claim 1, wherein a bottom surface of the through-contact is lower than a bottom surface of the vertical channel structure.

8. The 3D semiconductor memory device of claim 1, wherein the vertical channel structure comprises:
    a vertical semiconductor pattern; and
    a vertical insulating pattern disposed between the vertical semiconductor pattern and the electrode structure,
    wherein the vertical insulating pattern includes a data storage layer.

9. The 3D semiconductor memory device of claim 1, wherein the vertical channel structure includes a first vertical extension and a second vertical extension on the first vertical extension, and
    wherein a diameter of the vertical channel structure changes abruptly at an interface where the first vertical extension and a second vertical extension contact each other.

10. The 3D semiconductor memory device of claim 9, wherein a diameter of the through-contact continuously varies along a vertical direction.

11. A three-dimensional (3D) semiconductor memory device comprising:
    a substrate;
    a peripheral circuit structure on the substrate;
    an electrode structure including electrodes stacked on the peripheral circuit structure;
    a mold structure adjacent to the electrode structure, the mold structure including first insulating layers and second insulating layers that are alternately stacked on the peripheral circuit structure;
    a vertical channel structure penetrating the electrode structure;
    a dummy contact penetrating the mold structure; and
    a through-contact penetrating the mold structure to extend to the peripheral circuit structure,
    wherein a top surface of the dummy contact is higher than a top surface of the vertical channel structure.

12. The 3D semiconductor memory device of claim 11, further comprising a bit line electrically connected to the vertical channel structure,
    wherein the dummy contact is not electrically connected to the bit line.

13. The 3D semiconductor memory device of claim 11, wherein the peripheral circuit structure includes peripheral transistors and lower interconnection lines on the peripheral transistors, and
    wherein the through-contact is electrically connected to an uppermost one of the lower interconnection lines.

14. The 3D semiconductor memory device of claim 11, wherein the vertical channel structure includes a first vertical extension and a second vertical extension on the first vertical extension, and
    wherein a diameter of the vertical channel structure changes abruptly at an interface where the first vertical extension and a second vertical extension contact each other.

15. The 3D semiconductor memory device of claim 14, wherein a diameter of the through-contact continuously varies along a vertical direction.

16. A three-dimensional (3D) semiconductor memory device comprising:
    a substrate;
    a peripheral circuit structure on the substrate;

an electrode structure including electrodes stacked on the peripheral circuit structure;
a mold structure adjacent to the electrode structure, the mold structure including first insulating layers and second insulating layers that are alternately stacked on the peripheral circuit structure;
a vertical channel structure penetrating the electrode structure;
a dummy contact penetrating the mold structure; and
a through-contact penetrating the mold structure to extend to the peripheral circuit structure,
wherein a bottom surface of the through-contact is lower than a bottom surface of the vertical channel structure.

17. The 3D semiconductor memory device of claim 16, further comprising a bit line electrically connected to the vertical channel structure,
wherein the dummy contact is not electrically connected to the bit line.

18. The 3D semiconductor memory device of claim 16, wherein the peripheral circuit structure includes peripheral transistors and lower interconnection lines on the peripheral transistors, and
wherein the through-contact is electrically connected to an uppermost one of the lower interconnection lines.

19. The 3D semiconductor memory device of claim 16, wherein the vertical channel structure includes a first vertical extension and a second vertical extension on the first vertical extension, and
wherein a diameter of the vertical channel structure changes abruptly at an interface where the first vertical extension and a second vertical extension contact each other.

20. The 3D semiconductor memory device of claim 19, wherein a diameter of the through-contact continuously varies along a vertical direction.

\* \* \* \* \*